(12) United States Patent
Mallett et al.

(10) Patent No.: US 11,899,084 B2
(45) Date of Patent: Feb. 13, 2024

(54) MAGNETIC RESONANCE IMAGING DEVICE WITH ASYMMETRIC FIELD GENERATION UNIT

(71) Applicant: Siemens Healthcare GmbH, Erlangen (DE)

(72) Inventors: Michael Mallett, Faringdon (GB); Adrian Mark Thomas, Bicester (GB); Matthias Gebhardt, Erlangen (DE); Stephan Biber, Erlangen (DE); Andreas Krug, Fürth (DE); Stefan Popescu, Erlangen (DE); Lars Lauer, Neunkirchen (DE); Andreas Greiser, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/705,839

(22) Filed: Mar. 28, 2022

(65) Prior Publication Data

US 2022/0308142 A1 Sep. 29, 2022

(30) Foreign Application Priority Data

Mar. 29, 2021 (EP) .................................... 21165607

(51) Int. Cl.
*G01R 33/34* (2006.01)
*G01R 33/38* (2006.01)
(Continued)

(52) U.S. Cl.
CPC ......... *G01R 33/3806* (2013.01); *G01R 33/34* (2013.01); *G01R 33/34023* (2013.01);
(Continued)

(58) Field of Classification Search
CPC .............. G01R 33/543; G01R 33/5608; G01R 33/4828; G01R 33/3415; G01R 33/283; G01R 33/307; G01R 33/60; G01R 33/3806; G01R 33/34; G01R 33/34023; G01R 33/3815; G01R 33/383; G01R 33/385;
(Continued)

(56) References Cited

U.S. PATENT DOCUMENTS 4,818,966 A 4/1989 Miyamoto et al.
5,307,039 A 4/1994 Chari et al.
(Continued)

FOREIGN PATENT DOCUMENTS

EP 0284439 B1 1/2007
EP 2745130 A1 6/2014
(Continued)

*Primary Examiner* — Jermele M Hollington
*Assistant Examiner* — Taqi R Nasir
(74) *Attorney, Agent, or Firm* — Banner & Witcoff Ltd.

(57) ABSTRACT

A magnetic resonance imaging device may include a field generator for generating at least one magnetic gradient field. The field generator may include a first magnet and a second magnet confining an imaging volume of the magnetic resonance imaging device in two spatial directions. The first magnet and the second magnet may be arranged asymmetrically with respect to the imaging volume. The magnetic resonance imaging device may be used to perform a method for acquiring an image of a diagnostically relevant body region of a patient.

18 Claims, 9 Drawing Sheets

(51) Int. Cl.
  *G01R 33/3815* (2006.01)
  *G01R 33/383* (2006.01)
  *G01R 33/385* (2006.01)
  *G01R 33/421* (2006.01)
  *G01R 33/483* (2006.01)
  *G01R 33/56* (2006.01)
(52) U.S. Cl.
  CPC ......... *G01R 33/383* (2013.01); *G01R 33/385* (2013.01); *G01R 33/3815* (2013.01); *G01R 33/4215* (2013.01); *G01R 33/4835* (2013.01); *G01R 33/56* (2013.01)
(58) Field of Classification Search
  CPC ....................... G01R 33/4215; G01R 33/4835; G01R 33/56; G01V 3/32; E21B 49/08; E21B 2049/085; G01N 24/10
  See application file for complete search history.

(56) References Cited

U.S. PATENT DOCUMENTS

| | | |
|---|---|---|
| 5,717,333 A | 2/1998 | Frese et al. |
| 6,265,959 B1 | 7/2001 | Abele et al. |
| 2006/0055406 A1* | 3/2006 | Lvovsky .............. G01R 33/381 |
| | | 324/318 |
| 2020/0200844 A1* | 6/2020 | Boskamp ........... G01R 33/4215 |
| 2021/0341556 A1 | 11/2021 | Mallett et al. |

FOREIGN PATENT DOCUMENTS

| | | | |
|---|---|---|---|
| JP | 2003102699 A | 4/2003 | |
| WO | 9956293 A2 | 11/1999 | |
| WO | 2007004109 A1 | 1/2007 | |
| WO | WO-2007004109 A1 * | 1/2007 | ......... G01R 33/3806 |

* cited by examiner

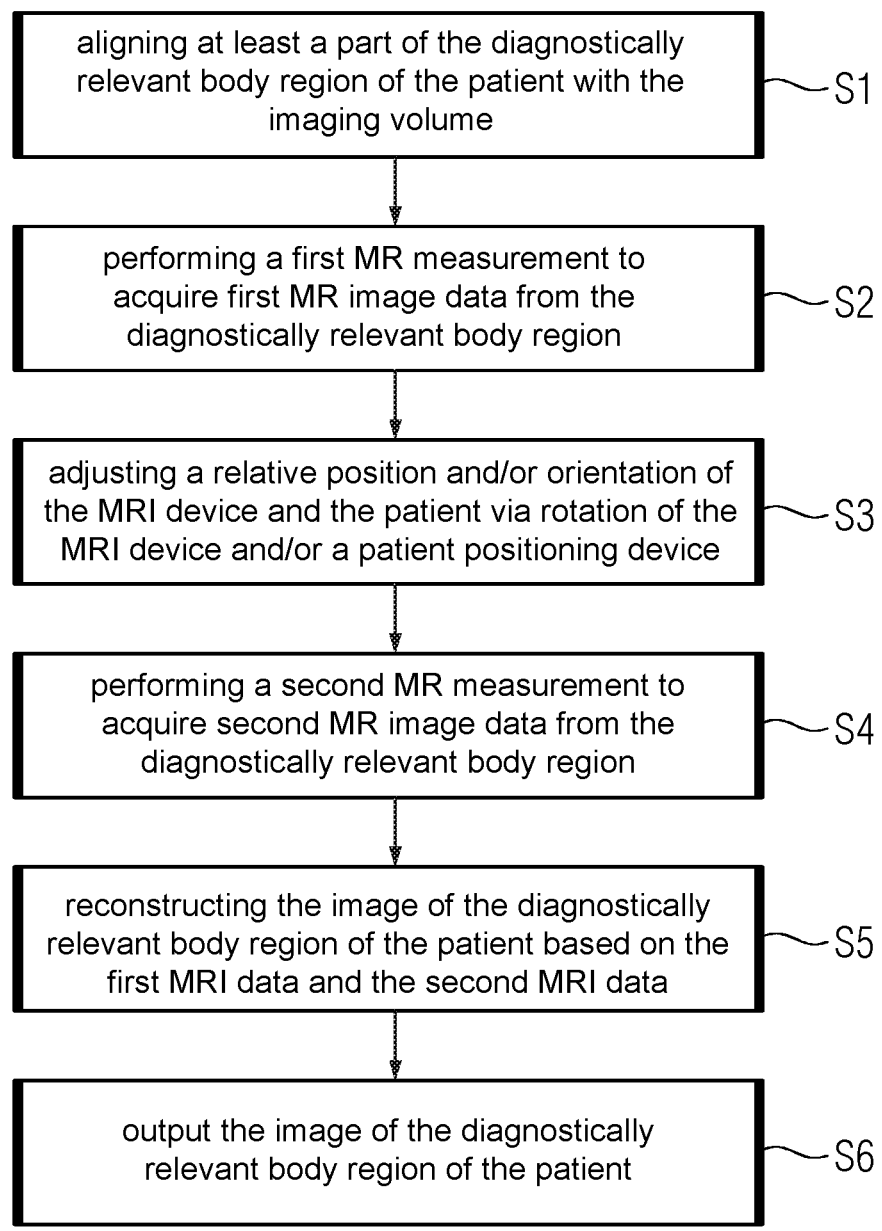

MAGNETIC RESONANCE IMAGING DEVICE WITH ASYMMETRIC FIELD GENERATION UNIT

CROSS REFERENCE TO RELATED APPLICATIONS

This patent application claims priority to European Patent Application No. 21165607.9, filed Mar. 29, 2021, which is incorporated herein by reference in its entirety.

BACKGROUND

Field

The disclosure relates to a magnetic resonance imaging device comprising a field generator for generating at least one magnetic gradient field, wherein the field generator comprises a first magnet and a second magnet confining an imaging volume of the magnetic resonance imaging device in two spatial directions and wherein the first magnet and the second magnet are arranged asymmetrically with respect to the imaging volume. The disclosure further relates to a method for acquiring an image of a diagnostically relevant body region of a patient with a magnetic resonance imaging device according to the disclosure.

Related Art

Magnetic resonance tomography represents a prominent imaging method for acquiring images of an interior of the examination object. For carrying out a magnetic resonance measurement, the examination object is usually positioned in a strong and homogeneous static magnetic field (B0 field) of a magnetic resonance imaging device. The static magnetic field may comprise magnetic field strengths of 0.2 Tesla to 7 Tesla, thus aligning nuclear spins inside the examination object along the static magnetic field. For triggering so-called nuclear spin resonances, radiofrequency excitation pulses are emitted into the examination subject. Each radiofrequency excitation pulse causes a magnetization of nuclear spins within the examination object to deviate from the static magnetic field by an amount which is known as the flip angle. A radiofrequency excitation pulse may comprise an alternating (electro-)magnetic field with a frequency which corresponds to the Larmor frequency at the respective static magnetic field strength. Excited nuclear spins may exhibit a rotating and decaying magnetization (nuclear magnetic resonance), which can be detected using dedicated radiofrequency antennas. For spatial encoding of measured data, rapidly switched magnetic gradient fields are superimposed on the static magnetic field.

The received nuclear magnetic resonances are typically digitized and stored as complex values in a k-space matrix. This k-space matrix can be used as a basis for a reconstruction of magnetic resonance images and for determining spectroscopic data. A magnetic resonance image is typically reconstructed by means of a multi-dimensional Fourier transformation of the k-space matrix.

During an imaging examination, the patient is typically enclosed in a bore or between a pair of magnets of the magnetic resonance imaging device. Due to spatial restrictions within the bore or a space between the pair of magnets, magnetic resonance imaging provides limited use for surgical procedures or biopsies. As the patient needs to be positioned inside the magnetic resonance imaging device, a size of the bore as well as other dimensions of the magnetic resonance imaging device are dictated by the size of the human body. From a cost and/or space utilization perspective, this may be unsatisfactory, especially if the examination is restricted to a body region of the patient, which is significantly smaller than an imaging volume provided by the magnetic resonance imaging device. Furthermore, patients with a claustrophobic condition or children may not tolerate elongated examination times usually associated with a magnetic resonance measurement.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 9 is a flowchart of a method according to an exemplary embodiment.

Figure 1:
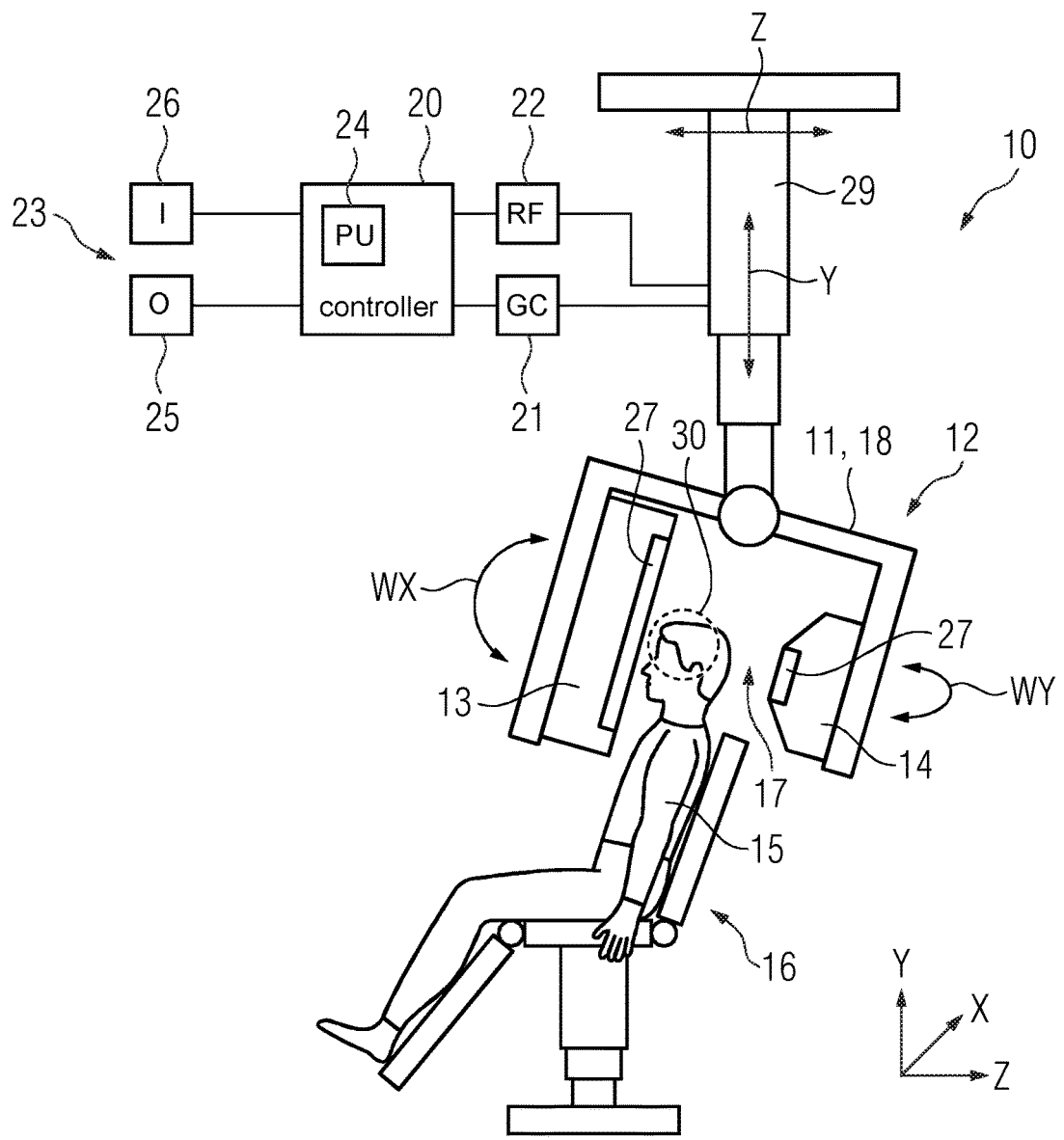
FIG. 1 is a schematic representation of a magnetic resonance imaging device according to an exemplary embodiment.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the disclosure is to provide a magnetic resonance imaging device with enhanced openness and/or accessibility for imaging of dedicated body regions of a patient.

In an exemplary embodiment, the inventive magnetic resonance imaging device comprises a field generator, wherein the field generator comprises a first magnet and a second magnet confining an imaging volume of the magnetic resonance imaging device from two spatial directions and wherein the field generator is configured to provide a static magnetic field within an imaging volume.

The first magnet may represent a main magnet providing the magnetic field within the imaging volume. A static magnetic field may be a B0-field of the magnetic resonance imaging device comprising either an essentially homogeneous magnet field or a predetermined magnetic gradient field within the imaging volume. The second magnet may be smaller than the first magnet. It is conceivable that the second magnet is primarily configured to improve a characteristic of the magnetic field provided by the first magnet, such as a magnetic field strength, a magnetic field direction and/or a magnetic field homogeneity, within the imaging volume. It is also conceivable, that the second magnet enhances an efficiency of the field generator in comparison to a unilateral magnet design. The first magnet and the second magnet may be carried by a supporting structure. The supporting structure may be mechanically connected to the first magnet and the second magnet to maintain a predetermined relative position of the first magnet and the second magnet.

In an exemplary embodiment, the first magnet and the second magnet are positioned along a common axis. The first magnet and/or the second magnet may be rotationally symmetric and the common axis may be an axis of rotational symmetry of the first magnet and the second magnet. The imaging volume of the field generator may be positioned along the common axis between the first magnet and the second magnet. However, the first magnet and the second magnet may also be positioned in such a way, that an axis of rotational symmetry of the first magnet is angled with respect to an axis of rotational symmetry of the second magnet. It is conceivable, that a trajectory defined by a centroid of a projection of the first magnet in the direction of the imaging volume corresponds to an axis of rotational symmetry of the first magnet. Likewise, a trajectory defined by a centroid of a projection of the second magnet in the direction of the imaging volume may correspond to an axis of rotational symmetry of the second magnet. However, the first magnet and/or the second magnet are not required to comprise a rotational symmetry. It is also conceivable, that a magnetic field axis of the first magnet corresponds to or is angled with respect to a magnetic field axis of the second magnet.

It is conceivable, that an axis through the first magnet and/or the second magnet and a center of the imaging volume is characterized by a trajectory of a centroid of a projection of the first magnet and/or the second magnet in the direction of the center of the imaging volume. The first magnet and the second magnet confine the imaging volume in two spatial directions. In one example, the first magnet may confine the imaging volume in a first spatial direction and the second magnet may confine the imaging volume in a second spatial direction which is different from the first spatial direction. The first spatial direction and the second spatial direction may be oriented in parallel. Particularly, the first spatial direction and the second spatial direction may be oriented in opposite directions at an angle of 180°. However, the two spatial directions may also be oriented at an angle below 180° or above 180°.

An imaging volume may be characterized by a predefined magnetic field direction and/or magnetic field strength. For example, the imaging volume may comprise a volume with a substantially uniform magnetic field direction and/or a uniform magnetic field strength. Such a volume may be an isocenter of the magnetic resonance imaging device. It is also conceivable, that the imaging volume comprises a predefined magnetic gradient field. Such a magnetic gradient field may be used for spatial encoding of magnetic resonance signals acquired from an examination object positioned within the imaging volume.

The first magnet and the second magnet are arranged asymmetrically with respect to the imaging volume. For example, the first magnet and the second magnet may be arranged asymmetrically with respect to any plane oriented orthogonally along a trajectory of a projection of the first magnet and/or the second magnet in a direction of the imaging volume. The term projection may be interpreted as an imaginary image of the first magnet and/or the second magnet on a two-dimensional plane. An asymmetric arrangement of the first magnet and the second magnet may also signify that a size, a shape, an amount of magnetic material, a magnetic field strength and/or an arbitrary other property of the first magnet differs from the second magnet. It is also conceivable, that an absolute distance between the first magnet and the imaging volume is different from an absolute distance between the second magnet and the imaging volume. In particular, the first magnet and the second magnet may comprise different shapes and/or geometries.

The first magnet and the second magnet are arranged in such a way to provide an access to the imaging volume along at least two perpendicular spatial directions, wherein a direction of access to the imaging volume is angled with respect to a main magnetic field direction of the magnetic field in the imaging volume.

As described above, the first magnet and the second magnet may be carried by a supporting structure and the imaging volume may be positioned in a free volume or gap between the first magnet and the second magnet. It is conceivable, that an access to the imaging volume is provided along any unobstructed line connecting an arbitrarily chosen position in an examination room with the center of the imaging volume. The examination room may be a room wherein the magnet resonance imaging device is positioned and/or wherein a magnetic resonance measurement may be performed. In one example, a first direction of access to the imaging volume may be oriented essentially perpendicular to the axis of rotational symmetry of the first magnet and/or the second magnet. A second direction of access may be oriented essentially perpendicular to the first direction of access and the axis of rotational symmetry of the first magnet and/or the second magnet. However, the first direction of access and/or the second direction of access may also comprise an arbitrary angle with respect to the axis of rotational symmetry of the first magnet and/or the second magnet. In an exemplary embodiment, the imaging volume may be accessed via a plurality of directions of access. In one embodiment, the imaging volume is accessible via at least two essentially perpendicular spatial directions. However, the imaging volume may also be accessible via three essentially perpendicular spatial directions. The three perpendicular spatial directions may correspond to the axes of a cartesian coordinate system, the origin of the cartesian coordinate system being positioned in the center of the imaging volume.

In one embodiment, the magnetic resonance imaging device includes a radiofrequency system comprising at least one radiofrequency antenna for transmitting and/or receiving radiofrequency radiation. The at least one radiofrequency antenna may be carried by the first magnet, the second magnet and/or the supporting structure. For example, the radiofrequency antenna may be positioned on or recessed into a pole face of the first magnet and/or the second magnet. However, the at least one radiofrequency antenna may also be configured as a local coil. Such a local coil may be attached to the examination object, e. g. a human or an animal. In particular, the radiofrequency antenna may be placed in different positions relative to the magnetic resonance imaging device.

In providing a magnetic resonance imaging device with an asymmetric arrangement of a first and a second magnet, an accessibility and/or an openness of the magnetic resonance imaging device can be enhanced in comparison to conventional magnetic resonance imaging devices. For example, a space for movement of an extremity of a patient and/or a medical instrument can advantageously be increased. Thus, a suitability of the magnetic resonance imaging device for surgical and/or therapeutical interventions can be increased.

As a further advantage, an obstruction of a view of the patient by a bore or a field generator of the magnetic resonance imaging device can significantly be reduced in comparison to conventional magnetic resonance imaging devices. Thus, abortions of a magnetic resonance measurements of claustrophobic patients may be reduced and an eye-contact between parents and children can be maintained during an imaging examination.

Due to an enhanced accessibility and/or openness, the inventive magnetic resonance imaging device may easily be combined with other imaging modalities, such as a flatbed or C-arm X-ray scanner, an ultrasound scanner, as well as optical imaging devices. Particularly, other imaging modalities may favorably provide high resolution navigator data which may be used to improve an efficiency of a magnetic resonance imaging examination as well as a quality of acquired magnetic resonance images.

In comparison to known C-type magnet arrangements, which may be susceptible to oscillations caused by vibrations in an environment and/or by a cold head, an inventive asymmetric arrangement of the field generator may also be less sensitive to dynamic field changes. Thus, a lighter construction of the supporting structure may be used decreasing costs and further enhancing accessibility and/or openness of the magnetic resonance imaging device.

According to an embodiment of the inventive magnetic resonance imaging device, the first magnet comprises a superconducting magnet and the second magnet comprises a permanent magnet or an electromagnet.

A permanent magnet may consist of any suitable magnetic material such as AlNiCo (aluminum-nickel-cobalt), NeFeB (neodymium-iron-boron) or SmCo (samarium-cobalt) alloys. Furthermore, the permanent magnet may comprise any desired shape. In one embodiment, the permanent magnet comprises a bar shape. A bar shape may include a cuboid bar shape, a cylindrical bar shape or a bar shape with a polygonal cross-section, such as a prism. Bar-shaped permanent magnets provide a low-cost solution for generating a magnetic field within the imaging volume. In another embodiment, the permanent magnet may be composed of smaller, stacked permanent magnets. The use of a permanent magnet may favorably avoid costs and space required for cooling equipment usually associated with superconducting magnets and electromagnets.

An electromagnet may be a non-superconducting magnet. Particularly, an electromagnet may comprise an electrical conductor wound around a magnetic core made of, for example, a ferromagnetic or ferrimagnetic material. The magnetic core of the electromagnet may comprise a cylindrical shape, a cuboid shape, a prism shape or any other desirable shape. By using an electromagnet, the magnetic field strength can be favorably increased in comparison to a permanent magnet of comparable size. Higher magnetic field strengths can advantageously enhance a quality and/or a signal-to-noise ratio of a magnetic resonance image acquired via the magnetic resonance imaging device.

A superconducting magnet may comprise coils and/or tubular magnet segments of superconducting wire. The superconducting wire may be connected to a cryostat to keep a temperature of the superconducting wire below a predefined value. In one example, liquid helium may be used as a coolant, ensuring a temperature of the superconducting wire below 4 K. The coils of superconducting wire may be arranged in a variety of shapes, such as a solenoid, as a substantially planar loop or a tubular magnet segment. By using a superconducting magnet, the magnetic field strength can favorably be increased in comparison to a permanent magnet or an electromagnet of comparable size.

In an exemplary embodiment, the first magnet is larger than the second magnet and comprises a superconducting magnet. The second magnet may comprise a permanent magnet as a low-cost solution for better control of a characteristic of the magnetic field provided by the first magnet.

According to a further embodiment of the magnetic resonance imaging device, the first magnet comprises a plurality of magnet segments, wherein each magnet segment comprises a magnetic field axis and wherein the magnetic field axes of the plurality of magnet segments are oriented in parallel to a magnetic field axis of the first magnet.

The magnet segments may be positioned separately from one another or adjacent to one another. A magnetic field axis may correspond to an axis passing through a south pole and a north pole of the first magnet. Particularly, the north pole may relate to a point on a surface of the first magnet, where a direction of the magnetic field is oriented away from the first magnet in an essentially linear fashion. Likewise, the south pole may relate to a point on a surface of the first magnet, where a direction of the magnetic field is oriented towards the first magnet in an essentially linear fashion. It is conceivable, that the magnetic field axis of the first magnet corresponds to an axis of rotational symmetry of the first magnet. The surface of the first magnet may be a pole face of the first magnet. In an exemplary embodiment, the magnetic field axes of the plurality of magnet segments substantially correspond to the magnetic field axis of the first magnet.

In one example, the first magnet comprises a superconducting magnet with a plurality of tubular magnet segments, wherein each tubular magnet segment comprises a wire coiled in such a way to provide a tubular shape. In an exemplary embodiment, the plurality of tubular magnet segments comprises a circular axial cross-section. However, the cross-section of the plurality of tubular magnet segments may also be elliptic, oval or polygonal. In this case, the first magnet may comprise a discrete rotational symmetry of a higher order of n>1. This may signify, that a rotation of the first magnet about the axis of rotational symmetry by an angle of 360°/n does not change the first magnet. A tubular magnet segment may represent a substantially planar or flat loop or coil of superconducting wire. In particular, the tubular magnet segment may comprise one or several windings of superconducting wire. A substantially planar or flat loop or coil of wire may be characterized in that a diameter or a circumference of the tubular magnet segment significantly exceeds its width along the axis of rotational symmetry of the first magnet. However, it is also conceivable, that the tubular magnet segment comprises a plurality of windings, thus comprising a more three-dimensional shape extending along the axis of rotational symmetry of the first magnet.

An axis of rotational symmetry of each tubular magnet segment may be positioned along the magnetic field axis and/or the axis of rotational symmetry of the first magnet. The plurality of tubular magnet segments may be positioned in uniform or arbitrary intervals along the axis of rotational symmetry of the first magnet. It is also conceivable that two or more tubular magnet segments with different diameters are concentrically arranged at essentially the same position on the axis of rotational symmetry of the first magnet. In an exemplary embodiment, the plurality of tubular magnet segments is electrically connected via dedicated bridges or wires. Such bridges or wires may comprise a highly conductive metal, such as gold, copper or aluminum, but also a superconducting material.

In a further embodiment of the magnetic resonance imaging device, the second magnet comprises a plurality of magnet segments, wherein each magnet segment comprises a magnetic field axis and wherein the magnetic field axes of the plurality of magnet segments are oriented in parallel to a magnetic field axis of the second magnet.

In providing a plurality of magnet segments arranged along the magnetic field axis of the first magnet, a property of the magnetic field within the imaging volume may advantageously be adapted to a specific imaging application. For example, a plurality of magnet segments may be arranged in such a way, that the position, the magnetic field strength and/or the magnetic field homogeneity of the magnetic field between the first magnet and the second magnet is optimized for imaging of an eye region or of a dental region of a patient.

According to one embodiment of the inventive magnetic resonance imaging device, each magnet segment comprises a tubular shape, wherein a diameter of at least a first magnet segment of the plurality of magnet segments differs from a diameter of at least a second magnet segment of the plurality of magnet segments. It is also conceivable, that a diameter of at least a third, at least a fourth or at least a fifth magnet segment differs from a diameter of the first magnet segment, the second magnet segment and/or other magnet segments. In one embodiment, each magnet segment of the plurality of magnet segment has a different diameter. However, it is also conceivable, that a number of two, three, four or more magnet segments of the plurality of magnet segments have the same diameter.

The magnetic field axis of each magnet segment of the plurality of magnet segments is positioned along the magnetic field axis of the first magnet in such a way, that an overall shape of the first magnet corresponds to a cone, a frustum, a disk, a cylinder or a sequence thereof. The magnetic field axis of each magnet segment may correspond to an axis of rotational symmetry of each magnet segment. However, as the magnet segments comprise coiled wires, a magnet segment, and thus the first magnet, may not be perfectly rotationally symmetric. The overall shape of the first magnet may be characterized by a shape of a virtual envelope or a virtual envelope curve circumferentially enclosing the plurality of magnet segments of the first magnet.

In one example, the first magnet may comprise a superconducting magnet with a plurality of tubular magnet segments. Each tubular magnet segment may comprise a wire coiled in such a way to provide a tubular shape. A number of tubular magnet segments of the plurality of tubular magnet segments may be arranged along the axis of rotational symmetry of the first magnet in such a way, that their diameters are increasing or decreasing in one direction, thus providing an overall shape of a cone or a frustum. In a further example, a number of tubular magnet segments arranged with decreasing diameters in one direction may be followed by a number of tubular magnet segments with increasing diameters in said direction, thus providing an overall shape of a disk or an hourglass. Of course, arbitrary shapes of the first magnet may be provided by correct sequencing of tubular magnet segments with different or uniform diameters.

Via an adequate sequencing of the plurality of magnet segments along the magnetic field axis of the first magnet, a position and/or a shape of the imaging volume may favorably be adapted to match a target anatomy, such as a prostate or a heart of a patient. Thus, a dedicated magnetic resonance imaging device may be provided, which enables a tailored coverage of the target anatomy while enhancing accessibility and/or openness in comparison to conventional magnetic resonance imaging devices. Furthermore, a size and/or a system cost of such a dedicated magnetic resonance imaging device may be reduced in comparison to conventional devices.

According to a further embodiment of the magnetic resonance imaging device, the first magnet and/or the second magnet comprise a combination of at least two of:
a permanent magnet,
an electromagnet,
a high temperature superconducting wire,
a low temperature superconducting wire and/or
an induced magnet.

In an exemplary embodiment, the first magnet or the second magnet comprises a combination of at least two of the magnets mentioned above. It is also conceivable, that the first magnet and the second magnet each comprise a combination of at least two of the above-mentioned magnets. A low temperature superconducting wire may comprise superconducting properties at a temperature of about 4 K, whereas high temperature superconducting materials may comprise superconducting properties at temperatures in the range of 30 to 90 K. Examples of high temperature superconductors or materials with high temperature superconducting properties are barium copper oxides (e.g. YBCO, ReBCO), calcium copper oxides (e.g. BSCCO) as well as doped fullerides (e.g. $Cs_2RbC_{60}$), magnesium diboride and the like. In one embodiment, one or more tubular magnet segments of a superconducting magnet may be arranged along an axis of rotational symmetry of the second magnet in such a way, that the one or more tubular magnet segments at least partially encompass a permanent magnet, an electromagnet or an induced magnet along at least a section of the axis of rotational symmetry. In a further example, the first magnet comprises a solenoid electromagnet or a superconducting magnet circumferentially encompassing a permanent magnet along at least a section of the axis of rotational symmetry of the first magnet. It is conceivable, that a permanent magnet, an electromagnet, an induced magnet or a superconducting magnet act as a stray field containment unit configured to align or modify a magnetic stray field of the field generator in a predefined manner. An induced magnet may be an iron pole, which is magnetized in the presence of another magnet. Of course, other combinations and/or arrangements of the types of magnets mentioned above are conceivable.

In using combinations and/or arrangements of different types of magnets, characteristics of the magnetic field may favorably be optimized for a specific imaging application. An optimized magnetic field may decrease costs of the magnetic resonance imaging device, but also improve an image quality, an image acquisition duration and/or a patient experience.

According to a further embodiment of the magnetic resonance imaging device, the first magnet comprises a superconducting magnet and the second magnet comprises a superconducting magnet, wherein the magnetic resonance imaging device comprises one of:

a combined cryostat connected to the first magnet and the second magnet or a first cryostat connected to the first magnet and a second cryostat connected to the second magnet.

A cryostat may comprise a coolant thermally coupled with the first magnet and/or the second magnet. The first magnet and the second magnet may comprise a high temperature superconducting material and/or a low temperature superconducting material which may be cooled at respective temperatures via the cryostat. The cryostat may be any kind of container, which is configured to store or preserve the coolant at a superconducting temperature of the first magnet and/or the second magnet. The cryostat may comprise a thermal insulation configured to reduce input of heat energy from components of the magnetic resonance imaging device and/or the environment of the magnetic resonance imaging device. In an exemplary embodiment, the cryostat contains a fluid with a low boiling point, such as argon, nitrogen, neon, helium and the like. It is conceivable, that the cryostat further comprises a pulse tube refrigerator, a Gifford-Mc-Mahon refrigerator, a Sterling cryocooler, a Joule-Thomson cooler and the like, which is configured to maintain a predetermined temperature of the coolant in the cryostat.

It is conceivable, that the first magnet and the second magnet are connected to a combined cryostat. For this purpose, sections of the combined cryostat may encompass at least a part of the first magnet and at least a part of the second magnet. However, the supporting structure carrying the first magnet and the second magnet may also comprise fluid channels configured to guide the coolant and enable a heat exchange between the coolant and superconducting wires of the first magnet and/or the second magnet. The coolant may be transported through the fluid channels via a compressor or similar a device.

In one embodiment, the first magnet may be connected to a first cryostat and the second magnet may be connected to a second cryostat. It is conceivable, that the first magnet comprises a low temperature superconducting magnet, whereas the second magnet comprises a high temperature superconducting magnet, thus requiring different temperature levels and a separation of respective coolants via the first cryostat and the second cryostat. However, the coolant may also be passed through fluid channels of the first magnet and subsequently through fluid channels of the second magnet. Thus, a temperature level of the coolant may be increased from the superconducting temperature of the low temperature superconducting magnet before passing through the high temperature superconducting magnet with a higher superconducting temperature. In this case, a combined cryostat may be sufficient to adequately cool both the first magnet and the second magnet.

In providing a suitable concept for cooling of the first magnet and the second magnet using a combined cryostat or a first cryostat and a second cryostat, spatial requirements for cooling equipment and/or energy costs associated with cooling of the magnetic resonance imaging device may favorably be reduced in comparison to conventional magnetic resonance imaging devices.

According to a further embodiment, the inventive magnetic resonance imaging device includes a supporting structure configured for providing structural support to the field generator, wherein the supporting structure comprises a positioner configured to adjust a position and/or an orientation of the field generator in at least one spatial direction.

The positioner may be configured to position the magnetic resonance device along one axis or along two perpendicular axes of a cartesian coordinate system. In an exemplary embodiment, the positioner is configured to position the magnetic resonance imaging device along three perpendicular axes of a cartesian coordinate system. For example, the positioner may comprise a rail system and/or a telescope system configured to transport the magnetic resonance imaging device along predetermined trajectories. The positioner may further comprise a hinge and/or a movable joint configured for adjusting an orientation of the magnetic resonance imaging device. For example, the magnetic resonance imaging device may be positioned and/or oriented relative to a diagnostically relevant body region of a patient via the positioner. The patient may rest in a predefined posture, such as a lying position, a sitting position or a standing position, while the magnetic resonance imaging device is positioned and/or oriented relative to the patient. An adjustment of the position and/or orientation of the magnetic resonance imaging device may involve adjusting a position of the imaging volume to cover at least a part of the diagnostically relevant body region. The patient may also be placed on a patient positioning device configured for positioning the patient in a desired orientation to the magnetic resonance imaging device.

In one embodiment, the magnetic resonance imaging device is configured as a mobile unit, wherein the supporting structure and/or the positioner are configured to enable an adjustment of a position and/or an orientation of the magnetic resonance imaging device and wherein the supporting structure and/or the positioner are detached from an examination room wherein the magnetic resonance imaging device is positioned. A mobile unit may comprise wheels and/or other means enabling an adjustment of a position and/or an orientation of the magnetic resonance imaging device. It is conceivable, that the wheels are mechanically connected to the supporting structure and/or represent at least a part of the positioner configured to adjust a position and/or an orientation of the field generator in at least one spatial direction. An examination room may be a dedicated space in a hospital or any sort of hall or room configured for performing a magnetic resonance measurement.

In providing a positioner, the imaging volume of the magnetic resonance imaging device may favorably be adapted to a position of a body region of an immobile or limited movable patient. A process of matching the imaging volume with the diagnostically relevant body region of the patient is advantageously facilitated by the asymmetric arrangement of the field generator providing more space for maneuvering the patient and/or the magnetic resonance imaging device.

In a further embodiment of the inventive magnetic resonance imaging device, the first magnet and/or the second magnet comprise a pole face directed towards the imaging volume, wherein the pole face directed towards the imaging volume of the first magnet and/or the second magnet comprises a non-planar surface.

A pole face may be characterized by a terminating surface of the first magnet and/or the second magnet. It is conceivable, that a magnetic field strength at the pole face of the first magnet and/or second magnet is particularly high. A pole face may also represent a side of the first magnet and/or second magnet, which is directed towards or away from the imaging volume. In the case of a permanent magnet, a pole face may be a terminating surface of a north pole and/or a south pole. In the case of a magnet comprising coiled wires, the pole face may relate to a surface of an imaginary membrane, an imaginary envelope or an imaginary envelope curve circumferentially enclosing the magnet. For example, a tubular magnet segment of a superconducting magnet may comprise a planar, circular pole face at each end of its tubular shape. However, in stacking or stringing together a plurality of tubular magnet segments with different diameters along a common axis of rotational symmetry, an imaginary envelope curve circumferentially enclosing the plurality of tubular magnet segments may comprise a pole face with a curved surface. A curvature or shape of the pole face may relate to a sequence of tubular magnet segments as well as their individual diameters. A non-planar surface of the pole face may be characterized by a curved, an arched an indented and/or a bulged surface of the pole face.

In one embodiment, the pole face directed towards the imaging volume of the first magnet and/or the second magnet comprises the shape of a cone, a frustum or a hemisphere.

In a further embodiment, the pole face directed towards the imaging volume of the first magnet and/or the pole face directed towards the imaging volume of the second magnet comprises a bulge and/or an indentation with an irregular or complex three-dimensional shape. It is conceivable that the non-planar surface of the pole face is shaped in such a way, that an accessibility to the imaging volume is enhanced in comparison to a planar pole face.

In an exemplary embodiment, the non-planar surface of the pole face directed towards the imaging volume of the first magnet and/or the second magnet comprises a cut-out and/or an indentation configured to accommodate a body part of a patient positioned in a gap between the first magnet and the second magnet.

In providing a first magnet and/or a second magnet with a non-planar surface, the accessibility to the imaging volume between the first magnet and the second magnet may favorably be enhanced. Thus, positioning a body region of the patient within the imaging volume may be facilitated. For example, the magnetic resonance imaging device may be dedicated dental scanner. Thus, the non-planar surface may be shaped as a cone which favorably accommodates for a shoulder of the patient, when a head of the patient is positioned between the first magnet and the second magnet. Furthermore, in providing a pole face with a cut-out and/or an indentation configured to accommodate a body part of the patient, a distance between the first magnet and the second magnet may favorably be decreased with minor impairment of the patient. Thus, a magnetic field strength and/or a magnetic field homogeneity in the imaging volume may favorably be increased.

In an exemplary embodiment, the inventive magnetic resonance imaging device further comprises a stray field containment unit configured to align a magnetic stray field of the field generator in such a way, that a magnetic field strength and/or a magnetic field homogeneity in a center of the imaging volume is increased, wherein the stray field containment unit comprises at least one of a backing plate attached to the first magnet and/or to the second magnet, wherein the backing plate comprises a ferromagnetic material and wherein the backing plate is attached to a pole face of the first magnet and/or the second magnet which is directed away from the imaging volume, a yoke attached to the first magnet and the second magnet, wherein the yoke comprises a ferromagnetic material, a shield coil, attached to the first magnet and/or the second magnet, wherein the shield coil comprises a circular shape and wherein a center of the shield coil is positioned along a trajectory defined by a centroid of the projection of the first magnet and/or the second magnet in the direction of the center of the imaging volume.

Examples for ferromagnetic materials are iron, cobalt, nickel, but also lanthanoids, gadolinium and the like. Ferromagnetic materials may be deployed as a solid material or as a fluid. For example, the backing plate and/or the yoke may be made of iron or an iron alloy.

The yoke may represent the supporting structure or at least a part of the supporting structure. Thus, the yoke may provide structural support to the field generator and maintain a predefined distance between the first magnet and the second magnet. Particularly, the yoke may be configured to counteract attractive magnetic forces between the first magnet and the second magnet. It is conceivable, that the yoke is attached to the pole faces of the first magnet and the second magnet, which are directed away from the imaging volume. The yoke may comprise a substantially C-shaped or U-shaped arm or pillar to avoid traversing or limiting a free volume in proximity to the imaging volume. The arm or pillar of the yoke may comprise one or more separate elements evenly distributed around the first magnet and the second magnet. However, the one or more separate elements of the arm or pillar may also be distributed on one side of the field generator.

The backing plate is attached to a side or pole face of the first magnet and/or the second magnet which is directed away from the imaging volume. In an exemplary embodiment, the backing plate is centered along the axis of rotational symmetry of the first magnet and/or the second magnet. The backing plate may also be centered along the magnet field axis of the first magnet and/or the second magnet. It is conceivable, that an axial cross-section of the backing plate matches an axial cross section of the first magnet and/or the second magnet. The baking plate and/or the yoke may also comprise a ferromagnetic fluid, such as ferromagnetic nanoparticles in a solution, a suspension or an emulsion. In this case, the ferromagnetic fluid may be enclosed in a dedicated container or channel within the backing plate and/or the yoke.

The shield coil may comprise a resistive wire comprising a highly conductive metal, such as gold, copper or aluminum. However, the shield coil may also comprise a superconducting material, such as a high temperature superconductor or a low temperature superconductor. The shield coil may be carried by the first magnet and/or the second magnet. For example, the shield coil may be mechanically attached to the first magnet and/or the second magnet. In an exemplary embodiment, a center of the essentially circular shield coil is positioned along the axis of rotational symmetry of the first magnet and/or the second magnet.

In one embodiment, the first magnet comprises a first shield coil and the second magnet comprises a second shield coil. In a further example, the first magnet comprises an iron backing plate, whereas the second magnet comprises a shield coil. In still a further example, the first magnet and the second magnet are carried by an iron yoke. However, the first magnet and or the second magnet may still comprise a shield coil for a better alignment of the magnetic stray field. Of course, further combinations and/or arrangements of the first magnet, the second magnet and the stray field containment unit are conceivable.

In providing a stray field containment unit according to an embodiment described above, an alignment of the magnetic stray field can advantageously be achieved without limiting or compromising the accessibility of the imaging volume. As a further advantage, characteristics of the magnetic field within the imaging volume may favorably be improved. Furthermore, a yoke connecting the first magnet and the second magnet may advantageously be used for magnetic field flux optimization but also provide mechanical support, vibration damping, a thermal bridge and/or a connection to a cryostat.

According to a further embodiment of the inventive magnetic resonance imaging device, the field generator comprises a gradient field system with at least one gradient coil for generating at least one magnetic gradient field, wherein the first magnet and/or the second magnet comprise a pole face directed towards the imaging volume and wherein the at least one gradient coil of the gradient system is
  positioned adjacent to the pole face directed towards the imaging volume of the first magnet and/or the second magnet and/or
  at least partially recessed into the pole face directed towards the imaging volume of the first magnet and/or the second magnet.

In an exemplary embodiment, the at least one gradient coil is positioned on the pole face directed towards the imaging volume of the first magnet, thus covering at least a part of said pole face. In particular, a surface of the at least one gradient coil may essentially match a non-planar surface of the magnetic pole face directed towards the imaging volume. However, it is also conceivable that the pole face directed towards the imaging volume of the first magnet comprises an indentation or a cut-out, wherein the at least one gradient coil is positioned. Thus, the at least one gradient coil may be at least partially recessed into said pole face of the first magnet.

In one embodiment, the second magnet may comprise a second gradient coil. Analogous to the at least one gradient coil, the second gradient coil may cover the pole face directed towards the imaging volume of the second magnet. It is also conceivable, that the second gradient coil is at least partially recessed into said pole face of the second magnet and/or matches a non-planar surface of said pole face of the second magnet.

The magnetic resonance imaging device may further comprise a third gradient coil. The third gradient coil may be carried by the first magnet and/or the second magnet. However, the third gradient coil may also be carried by the supporting structure. In one embodiment, the third gradient coil may be TRASE (transmit array spatial encoding) coil of a radiofrequency system. Such a TRASE coil may provide a radiofrequency excitation pulse phase gradient instead of a static gradient field provided by the first magnet and the second magnet. The TRASE coil may be carried, for example, by the first magnet, the second magnet and/or the supporting structure.

In still a further embodiment of the magnetic resonance imaging device, a third gradient coil is omitted. In this case, spatial encoding in one spatial direction may be provided via a predefined magnetic field gradient generated by the first magnet and the second magnet.

In positioning the at least one gradient coil on the pole face directed towards the imaging volume of the first magnet and/or the second magnet, a space efficient arrangement of the gradient system can favorably be provided.

According to a further embodiment of the inventive magnetic resonance imaging device, the first magnet and the second magnet are arranged in such a way, that an angle defining the access to the imaging volume exceeds 60°, 75°, 90° or 105°, wherein said angle is enclosed by the center of the imaging volume, the first magnet and the second magnet.

The angle defining the access to the imaging volume may be constituted by a first tangent to the first magnet through the center of the imaging volume and a second tangent to the second magnet through the center of the imaging volume excluding an axis of rotational symmetry of the first magnet and the second magnet. The first tangent and the second tangent may lie in a common plane oriented in parallel to the axis of rotational symmetry of the first magnet and/or the second magnet.

In an exemplary embodiment, the angle defining the access to the imaging volume exceeds 75°, 90° or 105°. The angle may be increased by reducing a dimension of the first magnet and/or the second magnet. It is also conceivable, that increasing the angle may be achieved by providing a first magnet and/or a second magnet with a non-planar pole face as described above.

Due to the asymmetric arrangement of the field generator, the inventive magnetic resonance imaging device may comprise an increased angle enclosed by the center of the imaging volume, the first magnet and the second magnet in comparison to conventional C-type magnetic resonance imaging devices, thus improving an accessibility of the imaging volume. For example, a magnetic resonance imaging examination of an extremity of the patient may require a main body of the patient to be placed outside the imaging volume. In increasing the angle enclosed by the center of the imaging volume, the first magnet and the second magnet, taking a comfortable posture during the magnetic resonance imaging examination can be facilitated. Furthermore, entering the space between the first magnet and the second magnet can advantageously be facilitated, especially for patients with movement impairment or pain.

According to one embodiment of the inventive magnetic resonance imaging device, a second distance between the center of the imaging volume and a nearest point on a pole face directed towards the imaging volume of the second magnet exceeds a first distance between the center of the imaging volume and a nearest point on a pole face directed towards the imaging volume of the first magnet and wherein a ratio of the second distance and the first distance ranges between 1.5 and 8.

The nearest point on a pole face directed towards the imaging volume of the first magnet may be positioned on the axis of rotational symmetry and/or the magnetic field axis of the first magnet. Likewise, the nearest point on a pole face directed towards the imaging volume of the second magnet may be positioned along the axis of rotational symmetry and/or the magnetic field axis of the second magnet. It is conceivable, that the axis of rotational symmetry and/or the magnetic field axis of the second magnet is oriented in parallel to the axis of rotational symmetry and/or the magnetic field axis of the first magnet. In an exemplary embodiment, the axis of rotational symmetry of the second magnet coincides with the axis of rotational symmetry of the first magnet. As the first magnet and the second magnet are arranged asymmetrically with respect to the imaging volume, the second distance exceeds the first distance. In an exemplary embodiment, the second distance exceeds the first distance by factor of at least 1.5, at least two, at least three, at least four or more.

When choosing a level of asymmetry, a suitable balance between a size of the imaging volume and a position between the first magnet and the second magnet may be considered. A larger imaging volume is typically positioned closer to the first magnet, whereas a smaller volume may typically be provided at a larger distance to the first magnet. Thus, a dimension of the imaging volume and/or a distance between the imaging volume and the first magnet may be adjusted via a size of the first magnet and a size of the second magnet.

The dimension of the imaging volume and/or the distance between the imaging volume and the first magnet may be defined by a position of a diagnostically relevant body region within the patient. For example, the first distance may have to exceed a depth of the diagnostically relevant body region within the body of the patient. At the same time, a distance between the first magnet and the second magnet may have to exceed a dimension of the body part which needs to be placed between the first magnet and the second magnet.

In providing an asymmetric arrangement of the first magnet and the second magnet, a distance between the imaging volume and the first magnet may be reduced in comparison to a conventional C-type magnetic resonance imaging device. Thus, body regions positioned eccentrically with respect to a main axis of the body of the patient, such as the eyes and/or the teeth, may favorably be imaged using a more compact asymmetric field generator. In reducing an overall size of the magnetic resonance imaging device, system costs may advantageously be reduced in comparison to conventional magnetic resonance imaging devices.

According to one embodiment of the inventive magnetic resonance imaging device, the imaging volume comprises the shape of an ellipsoid, a disk, a star, a polyhedron, a torus or a combination thereof.

The shape of the imaging volume may be adjusted by modifying a dimension and/or a shape of the first magnet and/or the second magnet, as well as a relative position between the first magnet and the second magnet. In one example, the first magnet comprises a superconducting magnet with a cone-shaped pole face directed towards the imaging volume. A length and/or inclination of the cone-shaped pole face may be adjusted via an arrangement and/or diameter of a plurality of tubular magnet segments of the superconducting magnet. However, the shape of the imaging volume may also be adjusted via a shape and/or position of the second magnet as well as a magnetic field containment unit.

In one embodiment, the imaging volume comprises a U-shape, a C-shape or the shape of a half-torus. An imaging volume with such shape may favorably be matched with a dental region, such as a jawbone or a dental arch, of the patient. In a further embodiment, the imaging volume comprises an ellipsoidal shape or an ovoid shape to enclose both eyes of a patient. In an exemplary embodiment, the shape of the imaging volume is matched with a shape of a target anatomy of the dedicated magnetic resonance imaging device.

In providing an imaging volume which is matched to the shape of a target anatomy, an acquisition of magnetic resonance image data can favorably be limited to the target anatomy, thus increasing efficiency an imaging examination. Furthermore, in providing a dedicated magnetic resonance imaging device with a matched imaging volume, a size of the magnetic resonance imaging device can advantageously be decreased in comparison to conventional magnetic resonance imaging devices.

According to an embodiment of the inventive magnetic resonance imaging device, the first magnet comprises a hole which is directed along an axis of rotational symmetry of the first magnet providing an unobstructed view from a free volume between the first magnet and the second magnet through the first magnet.

According to an alternative embodiment of the inventive magnetic resonance imaging device, the first magnet includes an output, wherein the output is positioned on the pole face directed towards the imaging volume of the first magnet and wherein the output comprises a display oriented in the direction of the imaging volume in such a way, that at least one eye of a patient is aligned with the display of the output, when the patient is appropriately positioned for an imaging examination within a free volume between the first magnet and the second magnet.

In an exemplary embodiment, the display is configured to provide visual content to the patient during an imaging examination. Visual content may comprise video and/or image material as well as associated audio which may be output via dedicated speakers of the output or the examination room. In one example, a free view through the first magnet is simulated via the output and a camera positioned on a backside of the first magnet facing away from the imaging volume. For this purpose, an output of the display of the output may comprise a video signal captured by the camera positioned on the backside of the first magnet. Thus, the patient may be given the impression of being able to look through the first magnet. However, other suitable visual content may be provided to entertain, inform and/or relax the patient. The output and/or the first magnet may comprise a mechanical frame configured to arrest the head of the patient in a predefined position and/or orientation. It is also conceivable, that the output is at least partially recessed into the pole face directed towards the imaging volume of the first magnet.

In providing a first magnet with a hole along the axis of rotational symmetry or an output, a patient positioned between the first magnet and the second magnet may favorably maintain visual contact with family members and/or members of the medical personnel, which are positioned behind the first magnet. Furthermore, the patient may be distracted from the imaging examination by providing entertaining or informational content via the output, thus reducing a risk of an abortion of the imaging examination, particularly in case of claustrophobic patients and/or children.

The inventive method for acquiring an image of a diagnostically relevant body region of a patient with a magnetic resonance imaging device according to an embodiment of the magnetic resonance imaging device described above comprises the steps:

aligning at least a part of the diagnostically relevant body region of the patient with the imaging volume, performing a first magnetic resonance measurement to acquire first magnetic resonance image data from the diagnostically relevant body region, adjusting a relative position and/or orientation of the magnetic resonance imaging device and the patient via rotation of the magnetic resonance imaging device and/or a patient positioning device, performing a second magnetic resonance measurement to acquire second magnetic resonance image data from the diagnostically relevant body region, reconstructing the image of the diagnostically relevant body region of the patient in dependence of the first magnetic resonance image data and the second magnetic resonance image data, outputting the image of the diagnostically relevant body region of the patient.

Aligning at least a part of the diagnostically relevant body region of the patient with the imaging volume may comprise adjusting a position and/or an orientation of the magnetic resonance imaging device and/or a patient positioning device in such a way, that at least a part of the diagnostically relevant body region is positioned within (or covered by) the imaging volume between the first magnet and the second magnet. As the first magnet and the second magnet are arranged asymmetrically, the part of the diagnostically relevant body region may be positioned closer to the first magnet than to the second magnet. A diagnostically relevant body region of the patient may be a jaw region, an eye region, a prostate, a heart and the like. However, other body regions are also conceivable.

Performing the first magnetic resonance measurement comprises acquiring first magnetic resonance image data from the part of the diagnostically relevant body region covered by the imaging volume.

Adjusting a relative position and/or orientation of the magnetic resonance imaging device and the patient may comprise rotating the magnetic resonance imaging device around the patient via the positioner. It is also conceivable, that the patient is rotated via the patient positioning device. In an exemplary embodiment, the patient positioning device comprises a chair for the patient to sit in or a standing aid for the patient to lean upon in an essentially upright position. The patient positioning device may comprise adjustment means for adjusting an orientation and/or a spatial position of the patient relative to the magnetic resonance imaging device. Rotating the magnetic resonance imaging device and/or the patient positioning device may cause the imaging volume to move along a substantially circular or curved trajectory relative to the diagnostically relevant body region, thus covering at least a further part of the diagnostically relevant body region. The rotation of the magnetic resonance imaging device and/or the patient may involve a discontinuous or a quasi-continuous motion.

Performing the second magnetic resonance measurement comprises acquiring second magnetic resonance image data from the further part of the diagnostically relevant body region. The imaging volume of the magnetic resonance imaging device may already cover the further part of the diagnostically relevant body region or move along the substantially circular or curved trajectory when the second magnetic resonance measurement is performed. It is conceivable, that at least a third, at least a fourth, at least a fifth or even further magnetic resonance measurements are performed in an analogous fashion to acquire magnetic resonance image data from a plurality of parts of the diagnostically relevant body region of the patient.

The image of the diagnostically relevant body region is reconstructed in dependence of the first magnetic resonance image data and the second magnetic resonance image data. In an exemplary embodiment, the image of the diagnostically relevant body region is reconstructed in dependence of magnetic resonance image data acquired from the plurality of parts of the diagnostically relevant body region of the patient. In an example, reconstructing the image of the diagnostically relevant body region may comprise reconstructing a first image from the first magnetic resonance image data and reconstructing a second image from the second magnetic resonance image data. The image of the diagnostically relevant body region may be created by stitching together the first image and the second image. However, it is also conceivable that the first magnetic resonance image data and the second magnetic resonance image data are merged in an image space (k-space) before reconstructing the image of the diagnostically relevant body region from the image space. Of course, other methods for reconstruction of the image of the diagnostically relevant body region in dependence of the first magnetic resonance imaging data and the second magnetic resonance image data may be used.

Outputting the image of the diagnostically relevant body region of the patient may comprise saving the image of the diagnostically relevant body region on a storage unit (memory) of the magnetic resonance imaging device, a medical information system and/or a cloud. However, it is also conceivable that the image of the diagnostically relevant body region is output via an output of the magnetic resonance imaging device.

In using the inventive method, magnetic resonance image data may favorably be acquired from a volume exceeding the imaging volume of the inventive magnetic resonance imaging device.

FIG. 1 depicts a schematic representation of an inventive magnetic resonance imaging device 10 configured to perform a magnetic resonance imaging examination of a jaw region and/or an eye region of a patient 15. An application of the magnetic resonance imaging device 10 for imaging of the jaw region and/or the eye region of the patient 15 is to be understood as an example. The inventive magnetic resonance imaging device 10 may also be configured to perform cardiac imaging, mammography imaging, neurological imaging, urological imaging, orthopedics imaging, prostate imaging or imaging of other body regions of the patient 15. For these imaging applications, the field generator 12 of the magnetic resonance imaging device 10 may be positioned and/or oriented relative to a diagnostically relevant body region of the patient 15 via the positioner 29.

The magnetic resonance imaging device 10 comprises a field generator 12 with a first magnet 13 and a second magnet 14. In the present example, the first magnet 13 and the second magnet 14 are carried by a supporting structure 11 which maintains a predefined distance between the first magnet 13 and the second magnet 14. The supporting structure 11 may also be implemented as an iron yoke 18. A free volume between the first magnet 13 and the second magnet 14 represents an image acquisition region 17 configured to receive an examination object 15, e.g. a body region of the patient 15. The image acquisition region 17 is confined by the field generator 12 in two spatial directions. The patient 15 may be positioned within the image acquisition region 17 by means of a patient positioning device 16. However, the magnetic resonance imaging device 10 may also comprise a positioner 29 for adjusting a position and/or an orientation of the field generator 12 with respect to the patient 15. For example, the positioner 29 may comprise a swivel joint configured to rotate the field generator 12 along a rotation direction WX and/or a rotation direction WY. A position of the field generator 12 along a Y-direction and/or a Z-direction may be adjusted via a suitable telescope system and/or rail system mechanically connected to the supporting structure 11. Of course, other embodiments of the supporting structure 11 and the positioner 29 are conceivable. In particular, the positioner 29 may further be configured to position the field generator 12 along an X direction and/or rotate the field generator 12 in a WZ direction (not shown).

The first magnet 13 is configured to generate a magnetic field in the image acquisition region 17, whereas the second magnet 14 may primarily be configured to enhance a characteristic of the magnetic field provided by the first magnet 13. The field generator 12 further comprises a gradient field system 27 with at least one gradient coil 28 for generating magnetic gradient fields used for spatial encoding of magnetic resonance signals acquired during a magnetic resonance imaging examination. In an exemplary embodiment, the field generator 12 comprises a radiofrequency system with at least one radiofrequency antenna (not shown) configured to emit a radiofrequency excitation pulse in the image acquisition region 17. The at least one radiofrequency antenna may also be configured to receive magnetic resonance signals from the image acquisition region 17, in particular the imaging volume 30. The at least one radiofrequency antenna may also be configured as a local coil.

In order to control the field generator 12 as well as the at least one radiofrequency antenna, the magnetic resonance imaging device 10 comprises a controller 20. The controller 20 is configured to control the magnetic resonance imaging device 10 to perform an imaging examination. For this purpose, the controller 20 may comprise a signal connection with a gradient controller 21 and a radiofrequency antenna controller 22. It is also conceivable, that the gradient controller 21 and the radiofrequency antenna controller 22 are integrated within the controller 20. In an exemplary embodiment, the controller 20 may comprise a processing unit 24 configured to coordinate an acquisition of magnetic resonance image data and/or a reconstruction of magnetic resonance image data acquired from the imaging volume 30. Additionally, or alternatively, the processing unit 24 is configured to evaluate and process data, such as magnetic resonance signals and/or magnetic resonance image data. In an exemplary embodiment, controller 20 may include a microcontroller, an analog circuit, a logic unit and the like. In an exemplary embodiment, the controller 20 and/or processing unit 24 includes processing circuitry (e.g. a processor, such as a CPU, a GPU and the like). Additionally, or alternatively, the controller 20 and/or the processing unit 24 comprise a memory and/or an internal storage, such as a RAM, a ROM, a PROM, an EPROM, an EEPROM, a flash memory, as well as an HDD, an SSD and the like. In an exemplary embodiment, processing circuitry of the processing unit 24 and/or controller 20 is configured to perform one or more functions and/or operations of the processing unit 24 and/or controller 20, including controlling the MR imaging device 10 (and/or one or more components therein), processing magnetic resonance signals, reconstructing magnetic resonance images, processing input from the user of the magnetic resonance imaging device 10 and/or providing an output to the user.

Furthermore, the magnetic resonance device 10 comprises a user interface 23, which has a signal connection to the controller 20. Control information, such as imaging parameters and/or magnetic resonance image data, can be displayed on an output 25. The output 25 may comprise at least one monitor configured to display control information and/or images acquired via the magnetic resonance imaging device 10 to an operator of the magnetic resonance imaging device 10. The magnetic resonance imaging device 10 may further comprise an input 26 configured to receive information and/or parameters input by the operator during an imaging examination. The input 26 may be a keyboard, mouse, touchscreen, microphone, or other input device as would be understood by one of ordinary skill in the art.

The illustrated magnetic resonance imaging device 10 may of course include further components that magnetic resonance imaging devices 10 usually comprise. The general mode of operation of a magnetic resonance imaging device 10 is well-known to the skilled person. Thus, a further description of the general components or a sequencing of an imaging examination is omitted for brevity.

Figure 2:
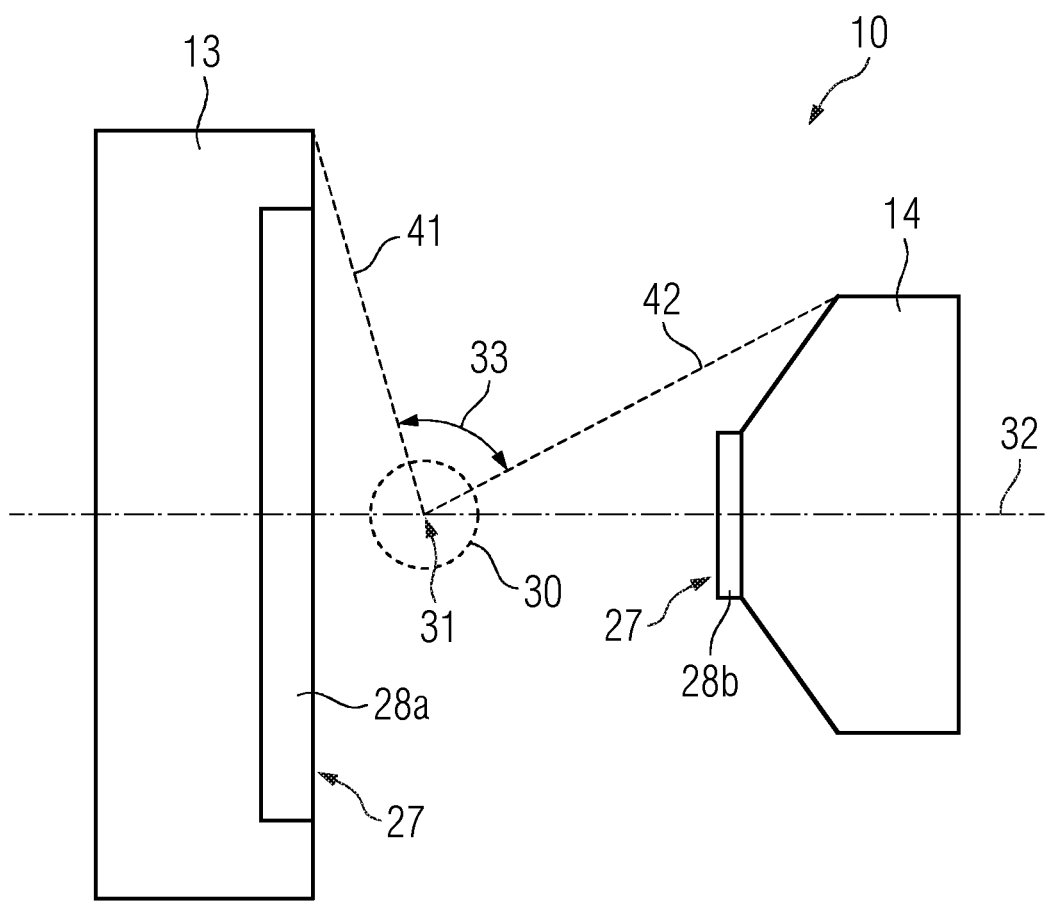
FIG. 2 is a schematic representation of a magnetic resonance imaging device according to an exemplary embodiment.
Figure 7:
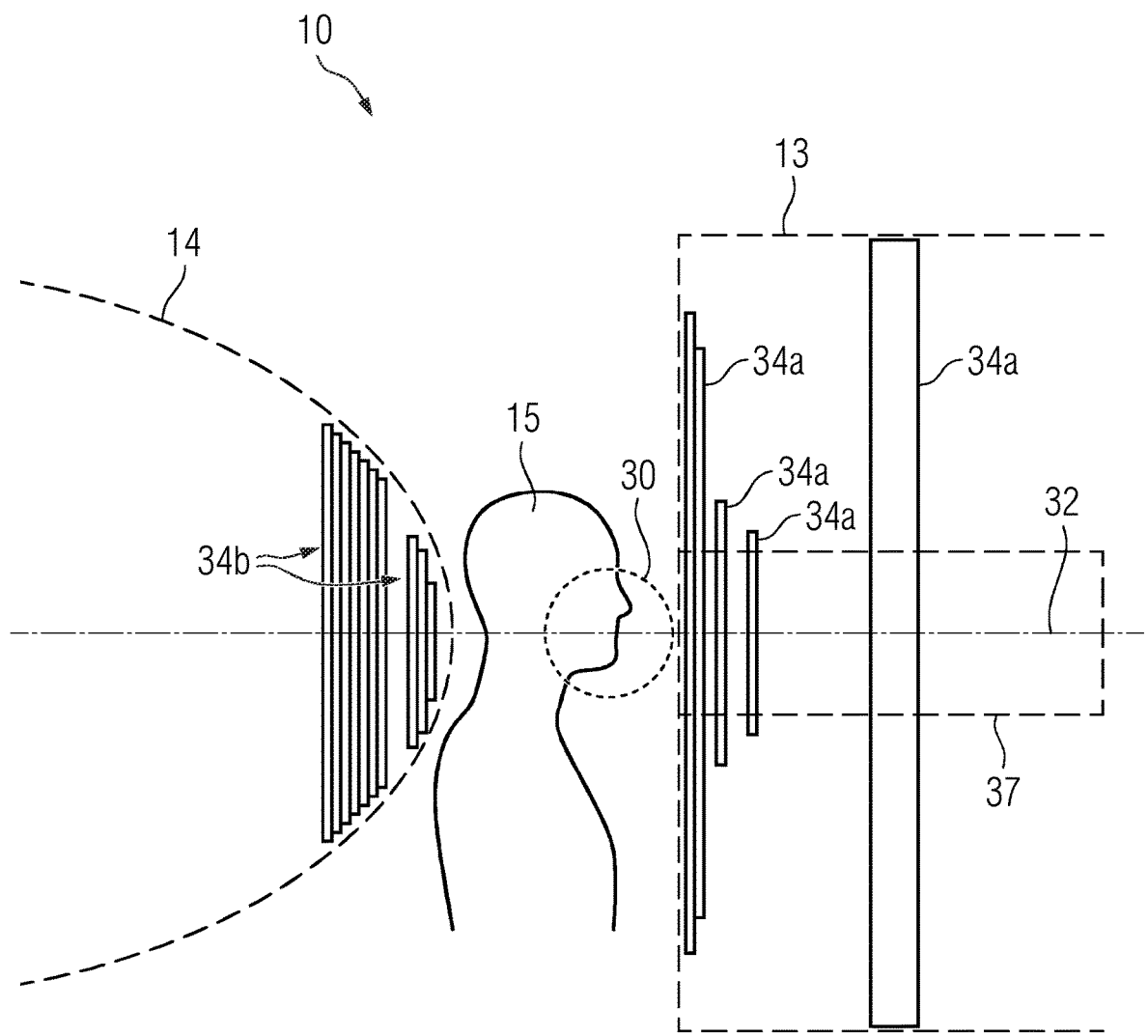
FIG. 7 is a schematic representation of a magnetic resonance imaging device according to an exemplary embodiment.

FIG. 2 shows a sectional view of an embodiment of an inventive magnetic resonance imaging device 10. In the present example, an angle 33 defining an access to the imaging volume 30 is enclosed by the center of the imaging volume 31, the first magnet 13 and the second magnet 14. The angle 33 is constituted by a first tangent 41 to the first magnet 13 through the center of the imaging volume 31 and a second tangent 42 to the second magnet 14 through the center of the imaging volume 31. The angle 33 excludes an axis 32 defined by a trajectory of a centroid of a projection of the first magnet 13 in the direction of the imaging volume 30. The axis 32 may correspond to the axis of rotational symmetry of the magnetic resonance imaging device 10. In an exemplary embodiment, the angle 33 exceeds 60°, 75°, 90° or 105°. The angle 33 may be increased by reducing a dimension of the first magnet 13 and/or the second magnet 14. However, it is also conceivable that increasing the angle 33 may be achieved by providing a first magnet 13 and/or a second magnet 14 with a non-planar pole face as shown in FIG. 7.

In the depicted embodiment, the gradient coil 28b of the second magnet 14 is positioned on the pole face directed towards the imaging volume 30 of the second magnet 14 in such a way, that it protrudes from the pole face. In contrast, the gradient coil 28a of the first magnet 13 is recessed into the pole face directed towards the imaging volume 30 of the first magnet 13. The magnetic resonance imaging device may comprise at least a third gradient coil 28, which is not depicted in FIG. 2.

Figure 3:
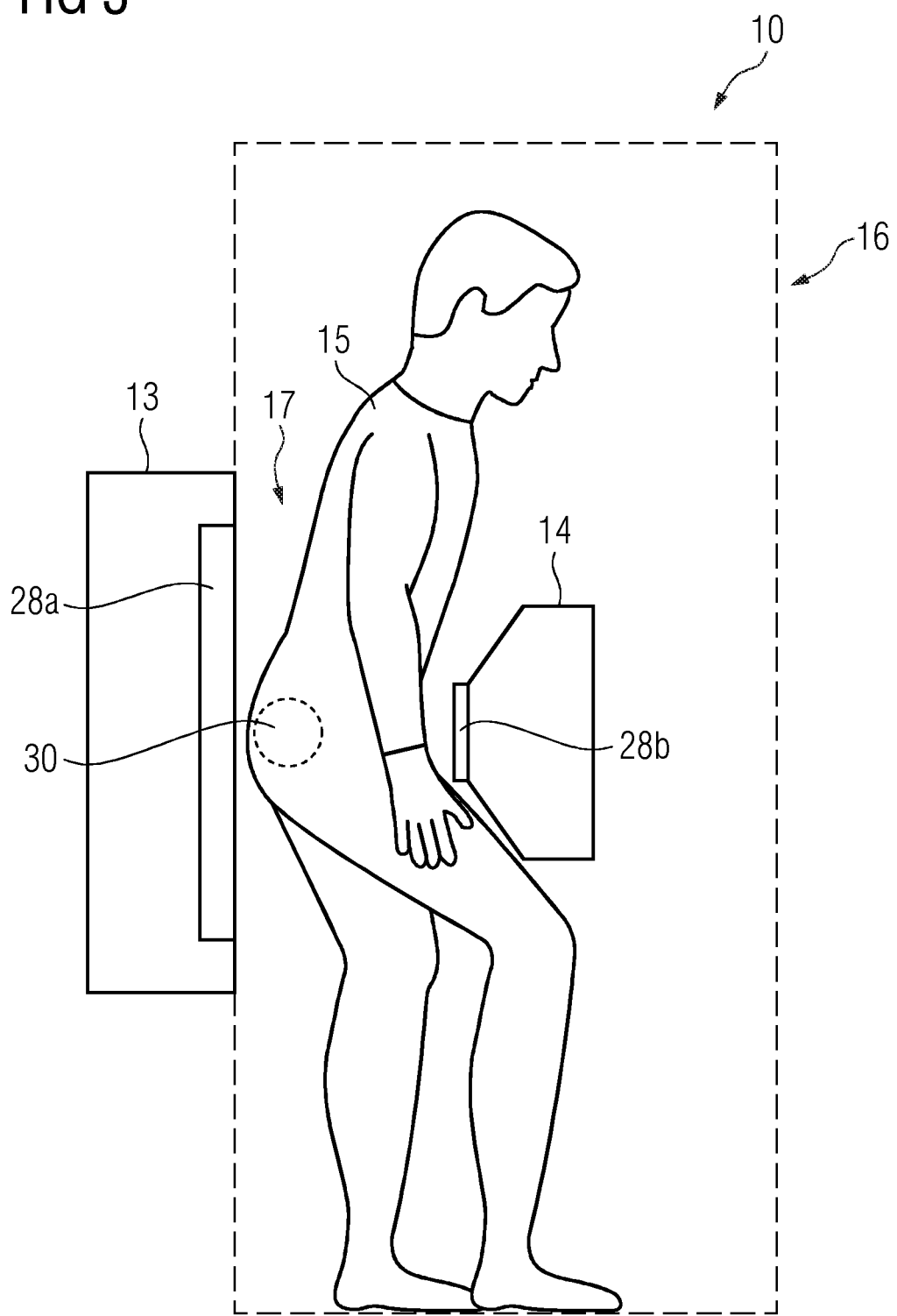
FIG. 3 is a schematic representation of a magnetic resonance imaging device according to an exemplary embodiment.

In FIG. 3, the magnetic resonance imaging device 10 is configured to perform an imaging examination of a prostate of the patient 15. The patient positioning device 16 may be a patient bed, configured to accommodate the patient 15 in a lateral decubitus position. The asymmetric arrangement of the first magnet 13 and the second magnet 14 with respect to the imaging volume 30 may facilitate a positioning of the patient 15 in the image acquisition region 17, especially for disabled and/or overweight patients 15. Due to an enhanced accessibility of the imaging volume 30 provided by the magnetic resonance imaging device 10, adjusting a relative position of the imaging volume 30 and the prostate of the patient 15 is facilitated. It is also conceivable, that a placement of a local coil, such as an endorectal coil or a surface coil, is facilitated in comparison to conventional or C-type magnetic resonance imaging devices.

Figure 4:
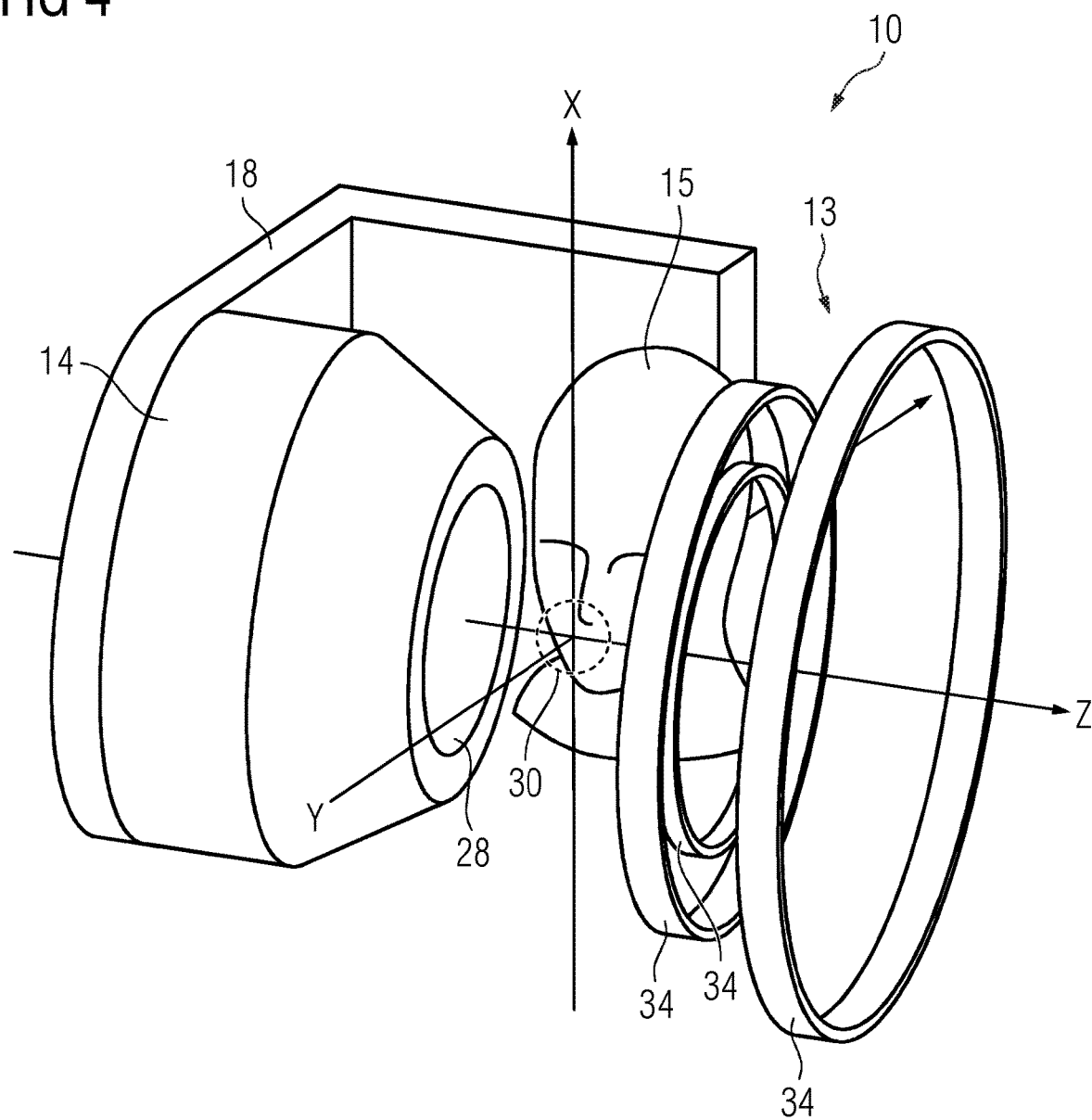
FIG. 4 is a representation of a magnetic resonance imaging device according to an exemplary embodiment.

FIG. 4 shows a further embodiment of the magnetic resonance imaging device 10. In the present example, the first magnet 13 comprises a superconducting magnet with a plurality of tubular magnet segments 34. In contrast, the second magnet 14 comprises a permanent magnet. The pole face directed towards the imaging volume 30 of the second magnet 14 is shaped like a frustum. The pole face directed towards the imaging volume 30 of the first magnet 13 is shaped like a cone, as the diameters of the tubular magnet segments 34 decrease in the direction of the imaging volume 30. The magnetic field axes of the tubular magnet segments 34 are oriented along the magnetic field axis of the first magnet 13. In the shown example, the first magnet 13 comprises an axis of rotational symmetry 32. The tubular magnet segments 34 are oriented in parallel and the axis of rotational symmetry of each tubular magnet segment 34 is positioned on the axis of rotational symmetry 32 of the first magnet 13.

In the present example, the magnetic resonance imaging device 10 also comprises an iron yoke 18. The iron yoke 18 is connected to the pole faces of the first magnet 13 and the second magnet 14, which are oriented away from the imaging volume 30. For improved visibility, the connection of the iron yoke 18 to the first magnet 13 is not shown in FIG. 4.

The magnetic resonance imaging device 10 further comprises at least one gradient coil 28 recessed into the pole face directed towards the imaging volume 30 of the second magnet 14. The at least one gradient coil 28 is embedded into the frustum-shaped section of said pole face in such a way, that a substantially flat surface is provided. However, the at least one gradient coil may also comprise a non-planar surface and/or protrude from the pole face directed towards the imaging volume 30 of the second magnet 14. The shaped pole faces of the first magnet 13 and the second magnet 14 increase the accessibility of the patient 15 to the imaging volume 30. For example, the patient 15 may easily access the imaging volume 30 from two perpendicular spatial directions, such as the X-direction and the Y-direction. At the same time, the imaging volume 30 is confined by the field generator 12 in a first direction oriented towards the first magnet 13 along the Z-direction and in a second direction oriented towards the second magnet 14 along the Z-direction. Furthermore, the shaped pole faces of the first magnet 13 and the second magnet 14 prevent a collision with the shoulders of the patient 15 (not shown) when the jaw region of the patient 15 is positioned within the imaging volume 30.

The frustum-shaped section of the second magnet 14 may be a tapered end-piece of the permanent magnet constituting the second magnet 14. However, it is also conceivable, that the frustum-shaped section is constituted by an induced magnet, preferably iron, which is connected or mounted to the second magnet 14.

Figure 5:
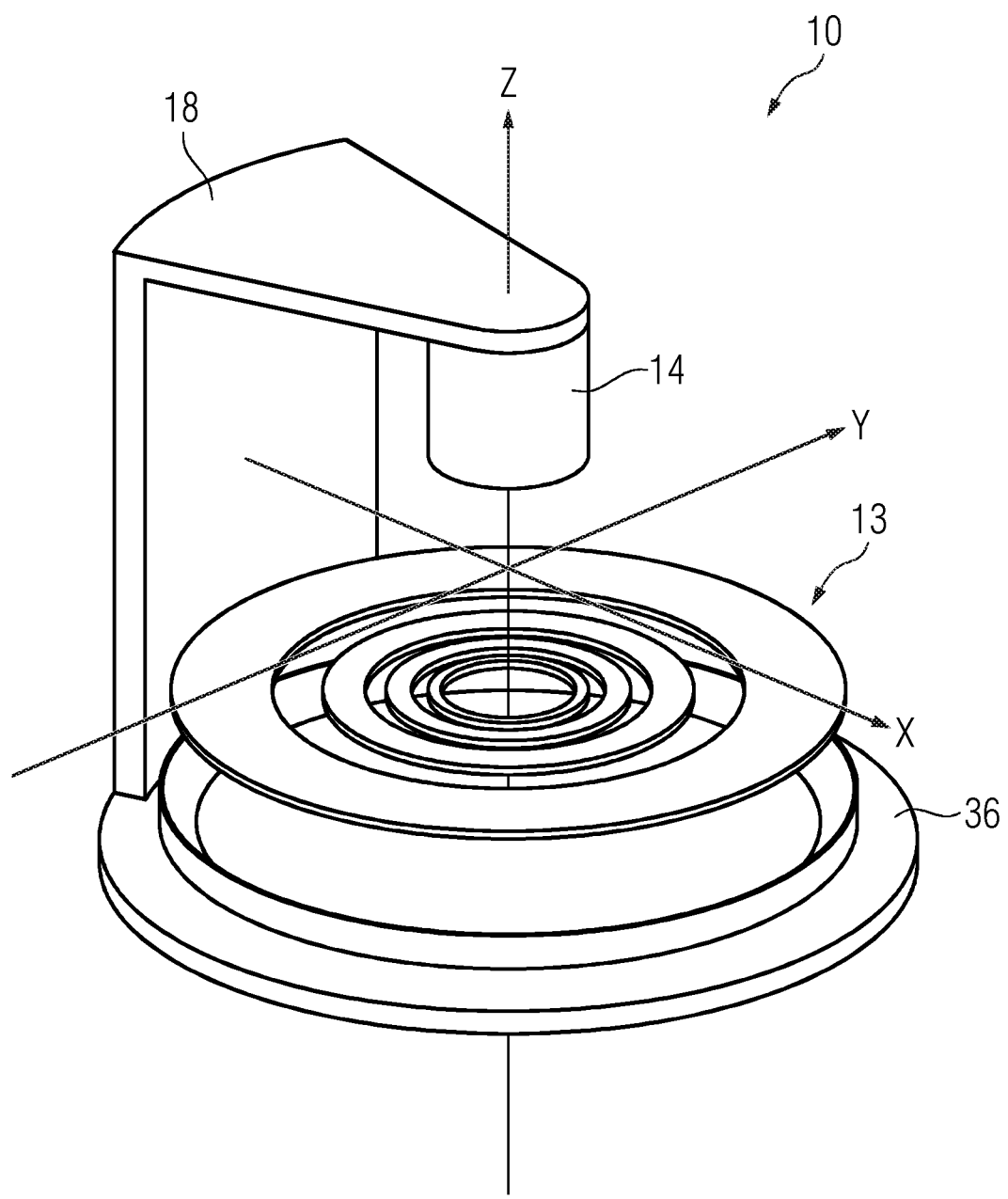
FIG. 5 is a representation of a magnetic resonance imaging device according to an exemplary embodiment.

FIG. 5 shows another embodiment of the inventive magnetic resonance imaging device 10. In present example, the second magnet 14 is an iron pole connected to an iron yoke 18. Due to the positioning of the iron pole relative to the magnetic field of the first magnet 13, the iron pole acts as an induced magnet. The iron yoke 18 is connected to a backing plate 36 covering the pole face of the first magnet 14 which is directed away from the imaging volume 30. It is conceivable, that the iron pole increases the magnetic field strength and/or the magnetic field homogeneity in the center of the imaging volume 31 in comparison to a permanent magnet with similar dimensions. Using a small iron pole may further increase the accessibility to the imaging volume 30.

Figure 6:
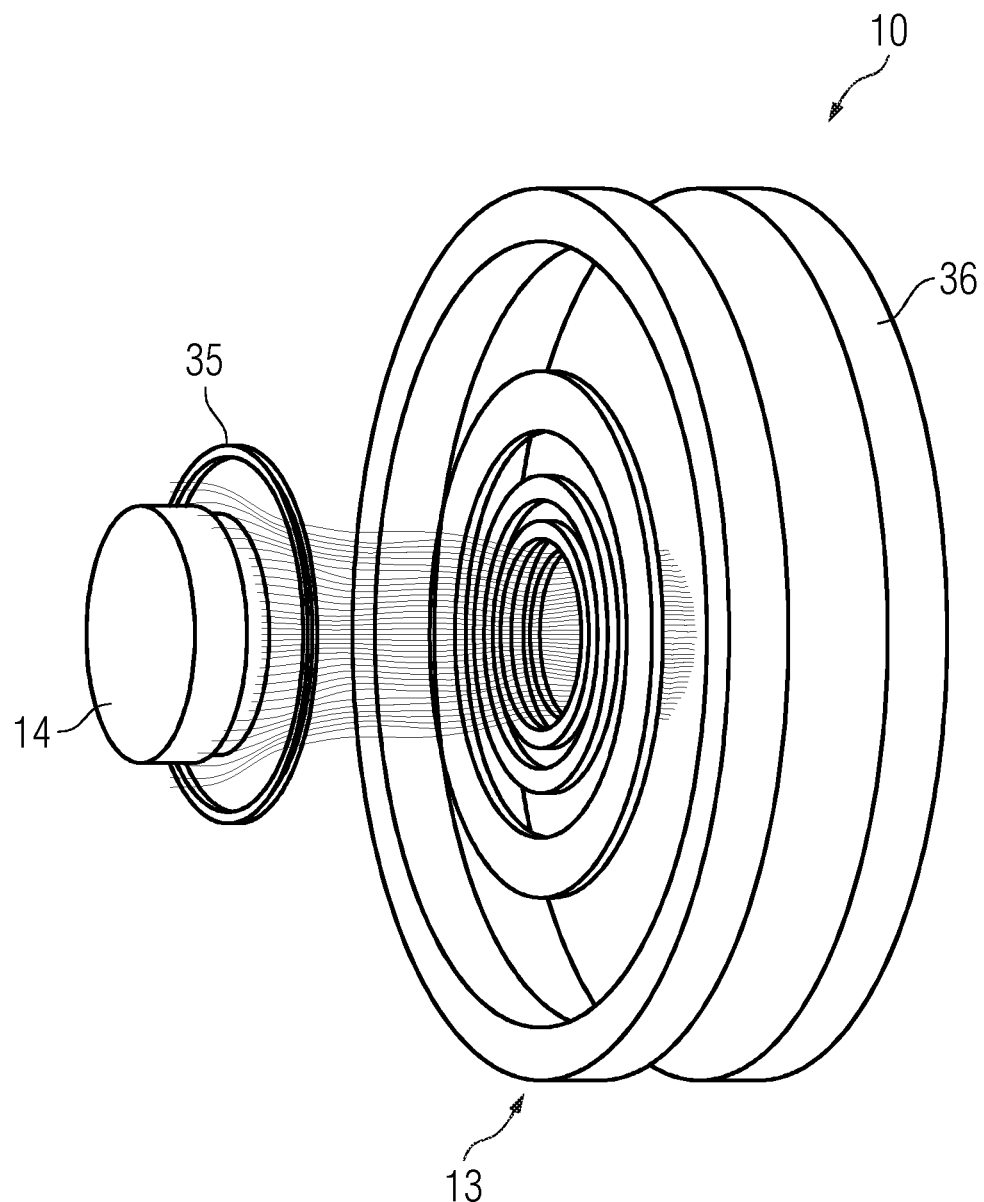
FIG. 6 is a representation of a magnetic resonance imaging device according to an exemplary embodiment.

FIG. 6 shows an embodiment of the inventive magnetic resonance imaging device 10 wherein the second magnet 14 comprises a shield coil 35. In accordance with the embodiment presented in FIG. 5, the first magnet 13 comprises a backing plate 36 as a magnetic stray field containment unit. However, the second magnet 14, which is also constituted by an iron pole, comprises a shield coil 35 as a stray field containment unit. The shield coil 35 may be attached to the second magnet 14 (not shown) in such way, that a center of the essentially circular wire of the shield coil 35 is positioned along the axis of rotational symmetry of the second magnet 14 or a trajectory of a centroid of a projection of the second magnet 14 in the direction of the imaging volume 30. As depicted in FIG. 6, the use of a shield coil 35 and a backing plate 36 may improve a characteristic of the magnetic field provided by the first magnet 13, such as a magnetic field homogeneity. It is conceivable, that the magnetic resonance imaging device 10 shown in FIG. 6 further comprises a supporting structure 11 to provide structural support to the first magnet 13 and the second magnet 14.

FIG. 7 depicts an embodiment of the inventive magnetic resonance imaging device 10, wherein the first magnet 13 and the second magnet 14 both comprise superconducting magnets. The magnetic resonance imaging device 10 also comprises an axis of rotational symmetry 32, which coincides with a trajectory of a centroid of a projection of the first magnet 13 in the direction of the imaging volume 30.

In the depicted example, the imaging volume 30 comprises an essentially spherical shape. However, the imaging volume 30 may also comprise a different shape, such as an ovoid shape, an ellipsoid shape, a disk shape, a star shape or a shape of a polyhedron.

An upper body of the patient 15 is positioned between the first magnet 13 and the second magnet 14 in such a way, that a position of the jaw region of the patient 15 coincides with a position of the imaging volume 30. The pole face directed towards the imaging volume 30 of the second magnet 14 may accommodate for the back or the shoulders of the patient 15 during an imaging examination, thus increasing patient comfort as well as the accessibility of the imaging volume 30. In the present embodiment, the angle 33 defining the accessibility of the imaging volume 30 (see FIG. 2) is increased by a tapering of the pole face directed towards the imaging volume 30 of the second magnet 14.

The superconducting magnets of the first magnet 13 and the second magnet 14 both comprise a plurality of tubular magnet segments 34a and 34b, which are oriented parallelly along the axis of rotational symmetry 32. The diameter of the tubular magnet segments 34b of the second magnet 14 decreases in a direction of the imaging volume 30, thus providing a cone-shaped pole face. The tubular magnet segments 34a of the first magnet 13 are arranged in such a way, that the diameter of a first group of tubular magnet segments decreases in the direction facing away from the imaging volume 30. The first group of tubular magnet segments is sequenced by a second group of tubular magnet segments with a larger diameter in a further distance to the imaging volume 30. The overall shape of the superconducting magnet may thus correspond to a frustum sequenced by a short cylindrical section. The pole face directed towards the imaging volume 30 of the first magnet 13 comprises a planar surface. This arrangement of the first magnet 13 and the second magnet 14 may be particularly suitable for accommodating the patient 15 in a standing or upright position.

The first magnet 13 may also comprise a hole 37 along the axis of rotational symmetry 32 to enable the patient 15 to view an area behind the first magnet 13. However, it is also conceivable that an output (not shown) with a display is recessed into the pole face directed towards the imaging volume 30 of the first magnet 13. The display of the output may provide entertaining or informational visual content and/or a video stream of a camera (not shown) positioned on a backside of the first magnet 13 to the patient 15.

Figure 8:
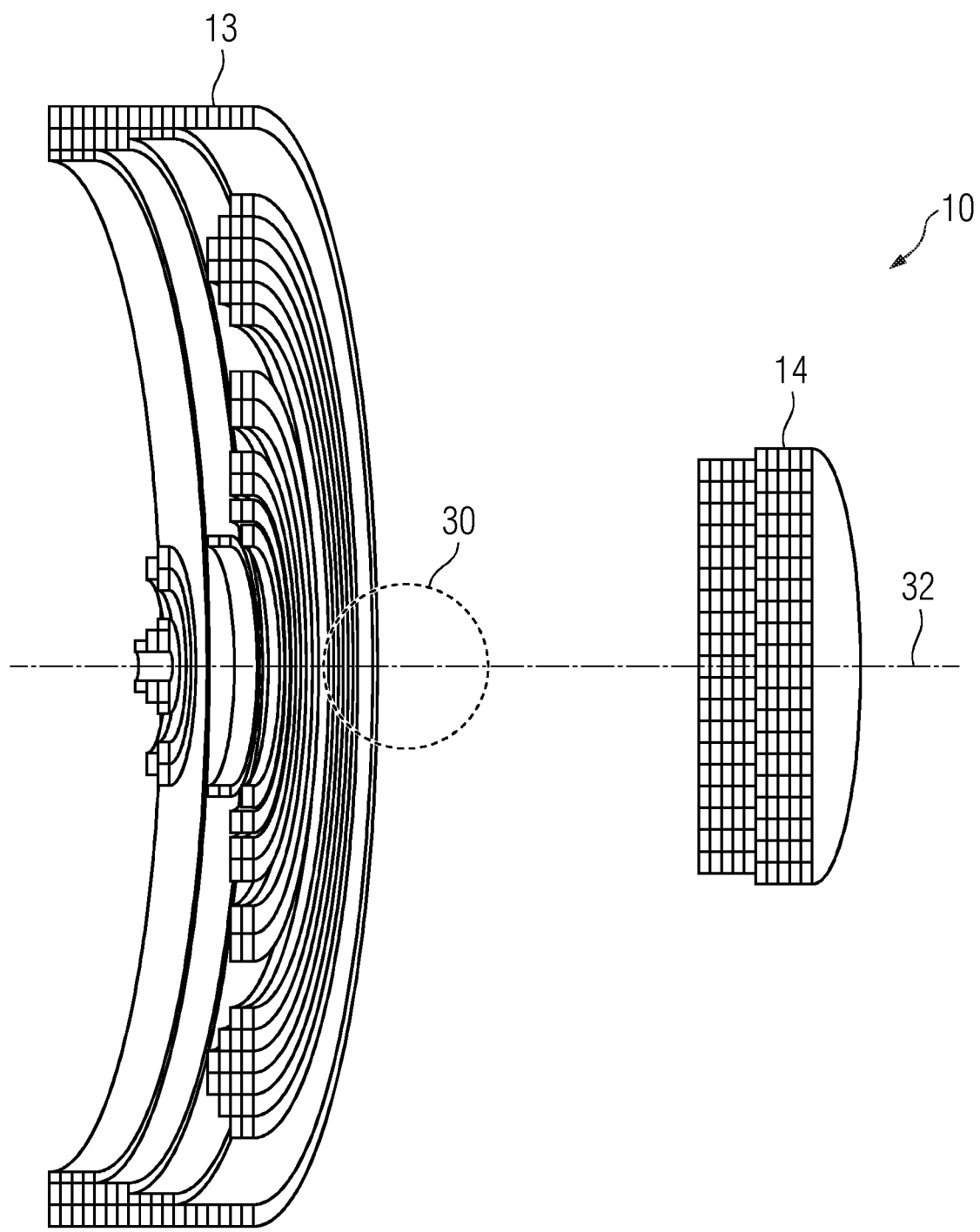
FIG. 8 is a representation of a magnetic resonance imaging device according to an exemplary embodiment.

FIG. 8 shows a further embodiment of the inventive magnetic resonance imaging device 10, comprising a permanent magnet as a second magnet 14 and a superconducting magnet as a first magnet 13. In the present example, the first magnet 13 comprises coils of superconducting wires, wherein the lighter colored sections of the first magnet 13 may correspond to reversed coils in comparison to the darker colored sections. The imaging volume 30 may be positioned in proximity to the first magnet 13. In the case of a dedicated magnetic resonance imaging device 10 for ophthalmologic imaging, the distance between the pole face directed towards the imaging volume 30 and the center of the imaging volume 31 may substantially correspond to a distance between a tip of a nose and a center of an eye of the patient 15. The imaging volume 30 may be spherical, as shown in FIG. 8, or oval. It is also conceivable that the imaging volume 30 comprises the shape of an ellipsoid, a disk, a star, a polyhedron, a torus or a combination thereof.

The axis of rotational symmetry of the second magnet 14 may coincide with the axis of rotational symmetry 32 of the first magnet 13. However, it is also conceivable that the axis of rotational symmetry of the second magnet 14 is shifted with respect to the axis of rotational symmetry of the first magnet 13 in a parallel manner. In a further embodiment, the axis of rotational symmetry of the second magnet 14 is angled with respect to the axis of rotational symmetry 32 of the first magnet 13.

FIG. 9 shows a flow diagram of the inventive method for acquiring an image of a diagnostically relevant body region of a patient 15 with a magnetic resonance imaging device 10 according to an embodiment described above.

In the step S1 at least a part of the diagnostically relevant body region of the patient 15 is aligned with the imaging volume 30. Aligning the diagnostically relevant body region of the patient 15 with the imaging volume 30 may comprise adjusting a position and/or an orientation of the patient 15 via a patient positioning device 16 as shown in FIG. 1 or FIG. 3. Positioning and/or orienting the patient 15 may be performed automatically, semi-automatically or manually. In an exemplary embodiment, aligning the diagnostically relevant body region of the patient 15 with the imaging volume 30 comprises adjusting a position and/or an orientation of the magnetic resonance imaging device 10 via the positioner 29 and/or the supporting structure 11. It is also conceivable, that a first aligning (e. g. a coarse aligning) of the diagnostically relevant body region of the patient 15 and the imaging volume 30 is accomplished via the patient positioning device 16 and a second aligning (e.g. a fine tuning) of the diagnostically relevant body region of the patient 15 and the imaging volume 30 is accomplished is accomplished via the positioner of the magnetic resonance imaging device 10 or vice versa. Aligning the imaging volume 30 with the diagnostically relevant body region may comprise adjusting a position of the imaging volume 30 to match a position of at least a part of the diagnostically relevant body region of the patient 15.

It is conceivable, that the diagnostically relevant body region of the patient 15 is larger than the imaging volume 30 of the magnetic resonance imaging device 10. Thus, after aligning the diagnostically relevant body region of the patient 15 with the imaging volume 30, only a part of the diagnostically relevant body region of the patient 15 may be covered by the imaging volume 30.

Due to the asymmetric arrangement of the field generator 12, some diagnostically relevant body regions of the patient 15 may be assessed by placing the patient in a gap between the first magnet 13 and the second magnet 14 either facing the first magnet 13 or the second magnet 14.

In the step S2, a first magnetic resonance measurement is performed to acquire first magnetic resonance image data from the diagnostically relevant body region. The magnetic resonance measurement may comprise an arbitrary imaging sequence, such as a UTE (ultra-short echo time), a ZTE (zero echo time), a TSE (turbo spin echo), a GRE (gradient echo) sequence or any other known imaging sequence appropriate for performing an imaging examination of the diagnostically relevant body region of the patient 15. The first magnetic resonance image data may be limited to the part of the diagnostically relevant body region of the patient 15 covered by the imaging volume 30 of the magnetic resonance imaging device 10.

The step S3 comprises adjusting a relative position and/or orientation of the magnetic resonance imaging device 10 and the patient 15 via rotation of the magnetic resonance imaging device 10 and/or a patient positioning device 16. As described above, a position and/or orientation of the magnetic resonance imaging device 10 and/or the patient positioning device 16 may be adjusted to align a further part of the diagnostically relevant body region with the imaging volume 30. In an exemplary embodiment, the first magnet 13 and the second magnet 14 are rotated around the patient 15 in such a way, that the imaging volume 30 covers a different part of the diagnostically relevant body region of the patient 15. The further part of the diagnostically relevant body region may exclude parts of the diagnostically relevant body region from which the first magnetic resonance image data have been acquired. However, the further part of the diagnostically relevant body region may also include at least a section of the diagnostically relevant body region from which the first magnetic resonance image data have been acquired.

In the step S4 a second magnetic resonance measurement is performed to acquire second magnetic resonance image data from the diagnostically relevant body region. In an exemplary embodiment, the second magnetic resonance measurement comprises a same type of imaging sequence used for the first magnetic resonance measurement. The second magnetic resonance image data may be limited to the further part of the diagnostically relevant body region covered by the adjusted imaging volume 30 according to step S3. However, the second magnetic resonance image data may also comprise sections of the diagnostically relevant body region, which are already comprised within the first magnetic resonance image data.

In one embodiment, the steps S3 and S4 are repeated several times, each time aligning a further part of the diagnostically relevant body region with the imaging volume 30 by adjusting a position and/or an orientation of the magnetic resonance imaging device 10 and/or the patient positioning device 16. In an exemplary embodiment, the magnetic resonance imaging device 10 is rotated with respect to the patient 15 in such way, that the center of the imaging volume 31 is positioned along a substantially circular or curved trajectory.

In the step S5 the image of the diagnostically relevant body region of the patient 15 is reconstructed in dependence of the first magnetic resonance image data and the second magnetic resonance image data. For example, reconstructing the image of the diagnostically relevant body region may comprise reconstructing a first image from the first magnetic resonance image data and a second image from the second magnetic resonance image data by means of the processing unit 24. The image of the diagnostically relevant body region may then be created by stitching together the first image and the second image. It is also conceivable, that the first image and the second image comprise sections of a same anatomic structure within the diagnostically relevant body region. Thus, the anatomic structure may be used to register the first image with the second image. However, it is also conceivable to merge the first magnetic resonance image data and the second magnetic resonance image data in an image space (k-space) before reconstructing the image of the diagnostically relevant body region.

It is conceivable, that the relative positions of the imaging volume 30 and the diagnostically relevant body region are selected in such a way, that a continuous imaging region covering the diagnostically relevant body region is obtained. For example, in case of a jawbone and/or a dental arch, the imaging region may follow the shape of a U or a C and consist of a plurality of imaging volumes positioned along a contour of the U or C. By subsequently acquiring magnetic resonance image data of parts of the diagnostically relevant body regions in different orientations of the magnetic resonance imaging device 10 with respect to the patient 15, a larger volume of the patient 15 may be covered than in a single position or in a symmetric imaging volume configuration (e.g. the patient 15 facing the first magnet 13 during the first magnetic resonance measurement and the second magnet 14 during the second magnetic resonance measurement). A similar effect may be achieved by continuously rotating the magnetic resonance imaging device 10 with respect to the patient 15, while acquiring the magnetic resonance image data.

In the step S6 the image of the diagnostically relevant body region of the patient 15 is output. Outputting may comprise saving the image of the diagnostically relevant body region on a storage unit of the magnetic resonance imaging device 10, a medical information system and/or a cloud. However, the image of the diagnostically relevant body region may also be output to the operator of the magnetic resonance imaging device 10 via the output 25 and/or an output unit positioned on the pole face of the first magnet 13 or second magnet 14 facing the patient 15.

The embodiments described above are to be recognized as examples. Individual embodiments may be extended by features of other embodiments. In particular, a sequence of the steps of the inventive methods are to be understood as exemplary. The individual steps can also be carried out in a different order or overlap partially or completely in time.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A magnetic resonance imaging (MRI) device comprising:
a field generator including a first magnet and a second magnet confining an imaging volume of the magnetic resonance imaging device in two spatial directions, the field generator being configured to provide a static magnetic field within the imaging volume, wherein:
the first magnet and the second magnet are arranged asymmetrically with respect to the imaging volume and configured to provide an access to the imaging volume along at least two perpendicular spatial directions, the first magnet and/or the second magnet including a pole face directed towards the imaging volume, wherein the pole face has a shape of a cone, a frustum, or a hemisphere; and
a direction of access to the imaging volume is angled with respect to a main magnetic field direction of the magnetic field in the imaging volume.

2. The MRI device according to claim 1, wherein the first magnet comprises a superconducting magnet and the second magnet comprises a permanent magnet or an electromagnet.

3. The MRI device according to claim 1, wherein:
the first magnet comprises a plurality of magnet segments, each of the magnet segments including a magnetic field axis, and
magnetic field axes of the plurality of magnet segments are oriented in parallel to a magnetic field axis of the first magnet.

4. The MRI device according to claim 3, wherein:
each of the magnet segments comprise a tubular shape;
a diameter of at least a first magnet segment of the plurality of magnet segments differs from a diameter of at least a second magnet segment of the plurality of magnet segments;
the magnetic field axis of each magnet segment of the plurality of magnet segments is positioned along the magnetic field axis of the first magnet such that an overall shape of the first magnet has a shape that corresponds to a cone and/or a frustum.

5. The MRI device according to claim 1, wherein the first magnet and/or the second magnet comprise a combination of at least two of:
a permanent magnet,
an electromagnet,
a high temperature superconducting wire,
a low temperature superconducting wire, and/or
an induced magnet.

6. The MRI device according to claim 1, wherein the first magnet comprises a superconducting magnet and the second magnet comprises a superconducting magnet, the magnetic resonance imaging device further including:
a combined cryostat connected to the first magnet and the second magnet; or
a first cryostat connected to the first magnet and a second cryostat connected to the second magnet.

7. The MRI device according to claim 1, further comprising a supporting structure configured for providing structural support to the field generator, the supporting structure including a positioner configured to adjust a position and/or an orientation of the field generator in at least one spatial direction.

8. The MRI device according to claim 1, wherein:
the pole face directed towards the imaging volume of the first magnet and/or the second magnet includes a non-planar surface.

9. The MRI device according to claim 1, further comprising: a stray field container configured to align a magnetic stray field of the field generator to increase a magnetic field strength and/or a magnetic field homogeneity in a center of the imaging volume, wherein the stray field container includes:
a yoke attached to the first magnet and the second magnet, wherein the yoke includes a ferromagnetic material; and/or
a shield coil attached to the first magnet and/or the second magnet, wherein the shield coil has a circular shape, a center of the shield coil being positioned along a trajectory defined by a centroid of a projection of the first magnet and/or the second magnet in the direction of the center of the imaging volume.

10. The MRI device according to claim 1, wherein the field generator comprises:
a gradient field system with at least one gradient coil configured to generate at least one magnetic gradient field, wherein the first magnet and/or the second magnet include a pole face directed towards the imaging volume, the at least one gradient coil of the gradient field system being:
positioned adjacent to the pole face directed towards the imaging volume of the first magnet and/or the second magnet; and/or
at least partially recessed into the pole face directed towards the imaging volume of the first magnet and/or the second magnet.

11. The MRI device according to claim 1, wherein the first magnet and the second magnet are arranged such that an angle defining the access to the imaging volume exceeds 60°, 75°, 90° or 105°, wherein the angle is enclosed by a center of the imaging volume, the first magnet and the second magnet.

12. The MRI device according to claim 11, wherein a second distance between the center of the imaging volume and a nearest point on a pole face directed towards the imaging volume of the second magnet exceeds a first distance between the center of the imaging volume and a nearest point on a pole face directed towards the imaging volume of the first magnet.

13. The MRI device according to claim 12, wherein a ratio of the second distance and the first distance ranges between 1.5 and 8.

14. The MRI device according to claim 1, wherein the imaging volume has a shape of an ellipsoid, a disk, a star, a polyhedron, and/or a torus.

15. The MRI device according to claim 1, wherein the pole face is a side or a surface of the first magnet and/or the second magnet.

16. The MRI device according to claim 1, wherein the pole face is a surface of an imaginary membrane, an imaginary envelope, or an imaginary envelope curve, circumferentially enclosing the first magnet and/or the second magnet.

17. A method for acquiring an image of a diagnostically relevant body region of a patient with a magnetic resonance imaging device, the method comprising:

aligning at least a part of the diagnostically relevant body region of the patient with the imaging volume;

performing a first magnetic resonance measurement to acquire first magnetic resonance image data from the diagnostically relevant body region;

adjusting a relative position and/or orientation of the magnetic resonance imaging device and the patient via rotation of the magnetic resonance imaging device and/or a patient positioning device;

performing a second magnetic resonance measurement to acquire second magnetic resonance image data from the diagnostically relevant body region;

reconstructing the image of the diagnostically relevant body region of the patient based on the first magnetic resonance image data and the second magnetic resonance image data; and generating and outputting an electronic data file corresponding to the reconstructed image of the diagnostically relevant body region of the patient.

18. A non-transitory computer-readable storage medium with an executable program stored thereon, that when executed, instructs a processor to perform the method of claim 17.

* * * * *